(12) United States Patent
Bishop et al.

(10) Patent No.: US 11,881,678 B1
(45) Date of Patent: Jan. 23, 2024

(54) PHOTONICS ASSEMBLY WITH A PHOTONICS DIE STACK

(71) Applicant: Apple Inc., Cupertino, CA (US)

(72) Inventors: Michael J. Bishop, San Carlos, CA (US); Kwan-Yu Lai, Campbell, CA (US); Alex Goldis, San Francisco, CA (US); Alfredo Bismuto, Oakland, CA (US); Jeffrey Thomas Hill, Los Altos, CA (US)

(73) Assignee: Apple Inc., Cupertino, CA (US)

( * ) Notice: Subject to any disclaimer, the term of this patent is extended or adjusted under 35 U.S.C. 154(b) by 555 days.

(21) Appl. No.: 17/015,766

(22) Filed: Sep. 9, 2020

Related U.S. Application Data

(60) Provisional application No. 62/897,647, filed on Sep. 9, 2019.

(51) Int. Cl.
*H01S 5/00* (2006.01)
*H01S 5/40* (2006.01)
(Continued)

(52) U.S. Cl.
CPC .............. *H01S 5/0071* (2013.01); *G02B 3/06* (2013.01); *G02B 6/12* (2013.01); *G02B 26/0833* (2013.01);
(Continued)

(58) Field of Classification Search
CPC .... H01S 5/0071; H01S 5/4043; H01S 5/4087; G02B 3/06; G02B 6/12; G02B 26/0833; G02B 26/105
See application file for complete search history.

(56) References Cited

U.S. PATENT DOCUMENTS

| 5,287,376 A | 2/1994 | Paoli |
| 5,488,678 A | 1/1996 | Taneya |

(Continued)

FOREIGN PATENT DOCUMENTS

| EP | 1403985 | 3/2004 |
| EP | 1432045 | 6/2004 |

(Continued)

OTHER PUBLICATIONS

U.S. Appl. No. 17/750,082, filed May 20, 2022, Witmer et al.
(Continued)

*Primary Examiner* — Peter Radkowski
(74) *Attorney, Agent, or Firm* — Brownstein Hyatt Farber Schreck, LLP

(57) ABSTRACT

Configurations for a photonics assembly and the operation thereof are disclosed. The photonics assembly may include multiple photonics dies which may be arranged in an offset vertical stack. The photonics dies may emit light, and in some examples, an optical element may be a detector for monitoring properties such as the wavelength of the light. The photonics dies may be arranged in a stack as a package and the packages may be stacked or arranged side by side or both for space savings. The PIC may include combining and/or collimating optics to receive light from the photonics dies, a mirror to redirect the light, and an aperture structure. The aperture structure may include a region which is at least partially transparent such that light transmits through the transparent region of the aperture structure. The aperture structure may include an at least partially opaque region which may be used for directing and/or controlling the light launch position.

20 Claims, 22 Drawing Sheets

(51) Int. Cl.
  *G02B 3/06*      (2006.01)
  *G02B 26/08*     (2006.01)
  *G02B 26/10*     (2006.01)
  *G02B 6/12*      (2006.01)

(52) U.S. Cl.
  CPC .......... *G02B 26/105* (2013.01); *H01S 5/4043* (2013.01); *H01S 5/4087* (2013.01)

(56) References Cited

U.S. PATENT DOCUMENTS

| | | | |
|---|---|---|---|
| 5,577,142 A | 11/1996 | Mueller-Fiedler et al. | |
| 5,644,667 A | 7/1997 | Tabuchi | |
| 5,742,631 A | 4/1998 | Paoli | |
| 6,122,042 A | 9/2000 | Wunderman et al. | |
| 6,330,378 B1 | 12/2001 | Forrest | |
| 6,393,185 B1 | 5/2002 | Deacon | |
| 6,461,059 B2 | 10/2002 | Ando et al. | |
| 6,465,929 B1 | 10/2002 | Levitan et al. | |
| 6,519,382 B1 | 2/2003 | Jurbergs | |
| 6,594,409 B2 | 7/2003 | Dutt et al. | |
| 6,628,686 B1 | 9/2003 | Sargent | |
| 6,628,858 B2 | 9/2003 | Zhang | |
| 6,657,723 B2 | 12/2003 | Cohen | |
| 6,795,622 B2 | 9/2004 | Forrest | |
| 6,801,679 B2 | 10/2004 | Koh | |
| 6,801,683 B2 | 10/2004 | Kanie et al. | |
| 6,823,098 B2 | 11/2004 | Guidotti et al. | |
| 6,873,763 B2 | 3/2005 | Nikonov | |
| 6,892,449 B1 | 5/2005 | Brophy et al. | |
| 6,898,222 B2* | 5/2005 | Hennig | H01S 5/4025 372/68 |
| 6,904,191 B2 | 6/2005 | Kubby | |
| 6,935,792 B2 | 8/2005 | Saia et al. | |
| 6,940,182 B2 | 9/2005 | Hilton et al. | |
| 6,947,639 B2 | 9/2005 | Singh | |
| 6,952,504 B2 | 10/2005 | Bi | |
| 6,955,481 B2 | 10/2005 | Colgan et al. | |
| 6,975,465 B1* | 12/2005 | Chung | G02B 19/0028 359/638 |
| 6,987,906 B2 | 1/2006 | Nakama et al. | |
| 7,054,517 B2 | 5/2006 | Mossberg | |
| 7,058,245 B2 | 6/2006 | Farahi | |
| 7,062,114 B2 | 6/2006 | Webjorn | |
| 7,079,715 B2 | 7/2006 | Kish | |
| 7,085,445 B2 | 8/2006 | Koh | |
| 7,203,401 B2 | 4/2007 | Mossberg | |
| 7,203,426 B2 | 4/2007 | Wu et al. | |
| 7,209,611 B2 | 4/2007 | Joyner | |
| 7,245,379 B2 | 7/2007 | Schwabe | |
| 7,283,694 B2 | 10/2007 | Welch | |
| 7,314,451 B2 | 1/2008 | Halperin et al. | |
| 7,315,039 B2 | 1/2008 | Kitagawa | |
| 7,324,195 B2 | 1/2008 | Packirisamy et al. | |
| 7,366,364 B2 | 4/2008 | Singh | |
| 7,447,393 B2 | 11/2008 | Yan | |
| 7,460,742 B2 | 12/2008 | Joyner | |
| 7,477,384 B2 | 1/2009 | Schwabe | |
| 7,483,599 B2 | 1/2009 | Dominic et al. | |
| 7,526,007 B2 | 4/2009 | Chua et al. | |
| 7,558,301 B2 | 7/2009 | Lin et al. | |
| 7,577,327 B2 | 8/2009 | Blauvelt et al. | |
| 7,612,881 B2 | 11/2009 | Ban et al. | |
| 7,680,364 B2 | 3/2010 | Nilsson | |
| 7,720,328 B2 | 5/2010 | Yan | |
| 7,885,302 B2 | 2/2011 | Eberhard | |
| 7,885,492 B2 | 2/2011 | Welch | |
| 7,974,504 B2 | 7/2011 | Nagarajan | |
| 8,300,994 B2 | 10/2012 | Welch et al. | |
| 8,548,287 B2 | 10/2013 | Thacker et al. | |
| 8,559,775 B2 | 10/2013 | Babie et al. | |
| 8,564,784 B2 | 10/2013 | Wang et al. | |
| 8,659,813 B2* | 2/2014 | Davis | G02B 1/005 359/201.1 |
| 8,724,100 B1 | 5/2014 | Asghari et al. | |
| 8,774,569 B2 | 7/2014 | Dougherty et al. | |
| 8,920,332 B2 | 12/2014 | Hong et al. | |
| 8,983,250 B2 | 3/2015 | Black et al. | |
| 9,020,004 B2 | 4/2015 | Jeong | |
| 9,031,412 B2 | 5/2015 | Nagarajan | |
| 9,064,988 B2 | 6/2015 | Hsiao et al. | |
| 9,091,594 B2 | 7/2015 | Furstenberg et al. | |
| 9,110,259 B1 | 8/2015 | Black | |
| 9,135,397 B2 | 9/2015 | Denyer et al. | |
| 9,176,282 B2 | 11/2015 | Pottier | |
| 9,217,669 B2 | 12/2015 | Wu et al. | |
| 9,310,248 B2* | 4/2016 | Karlsen | H01S 5/4025 |
| 9,348,154 B2 | 5/2016 | Hayakawa | |
| 9,370,689 B2 | 6/2016 | Guillama et al. | |
| 9,405,066 B2 | 8/2016 | Mahgerefteh | |
| 9,543,736 B1 | 1/2017 | Barwicz et al. | |
| 9,620,931 B2 | 4/2017 | Tanaka | |
| 9,715,064 B1 | 7/2017 | Gambino et al. | |
| 9,766,370 B2 | 9/2017 | Aloe et al. | |
| 9,804,027 B2 | 10/2017 | Fish et al. | |
| 9,829,631 B2 | 11/2017 | Lambert | |
| 9,874,701 B2 | 1/2018 | Baets et al. | |
| 9,880,352 B2 | 1/2018 | Florjanczyk | |
| 9,943,237 B2 | 4/2018 | Baker et al. | |
| 9,948,063 B2 | 4/2018 | Caneau et al. | |
| 10,009,668 B2 | 6/2018 | Liboiron-Ladouceur | |
| 10,046,229 B2 | 8/2018 | Tran et al. | |
| 10,132,996 B2 | 11/2018 | Lambert | |
| 10,203,762 B2 | 2/2019 | Bradski et al. | |
| 10,238,351 B2 | 3/2019 | Halperin et al. | |
| 10,268,043 B2* | 4/2019 | Zhou | G02B 3/06 |
| 10,283,939 B2* | 5/2019 | Dawson | H01S 5/02251 |
| 10,285,898 B2 | 5/2019 | Douglas et al. | |
| 10,295,740 B2 | 5/2019 | Bourstein et al. | |
| 10,310,196 B2 | 6/2019 | Hutchison | |
| 10,374,699 B2 | 8/2019 | Ji et al. | |
| 10,429,582 B1 | 10/2019 | Bian et al. | |
| 10,429,597 B2 | 10/2019 | ten Have et al. | |
| 10,436,028 B2 | 10/2019 | Dai et al. | |
| 10,511,146 B2 | 12/2019 | Lebby et al. | |
| 10,529,003 B2 | 1/2020 | Mazed | |
| 10,634,843 B2 | 4/2020 | Bayn et al. | |
| 10,656,429 B2* | 5/2020 | Zhou | G02B 5/1814 |
| 10,687,718 B2 | 6/2020 | Allec et al. | |
| 10,823,912 B1 | 11/2020 | Pelc et al. | |
| 10,852,492 B1 | 12/2020 | Vermeulen et al. | |
| 10,985,524 B1 | 4/2021 | Bayn et al. | |
| 11,086,088 B2 | 8/2021 | Huebner et al. | |
| 11,320,718 B1 | 5/2022 | Mahmoud et al. | |
| 11,480,728 B2 | 10/2022 | Bayn et al. | |
| 11,482,513 B2 | 10/2022 | Krasulick et al. | |
| 11,500,139 B2* | 11/2022 | Zhou | G02B 27/1086 |
| 11,525,967 B1 | 12/2022 | Bismuto et al. | |
| 2003/0099267 A1* | 5/2003 | Hennig | H01S 5/4025 372/44.01 |
| 2004/0208428 A1 | 10/2004 | Kikuchi et al. | |
| 2005/0053112 A1 | 3/2005 | Shams-Zadeh-Amiri | |
| 2005/0063431 A1 | 3/2005 | Gallup et al. | |
| 2006/0002443 A1 | 1/2006 | Farber et al. | |
| 2006/0013585 A1 | 1/2006 | Hnatiw et al. | |
| 2006/0045144 A1* | 3/2006 | Karlsen | H01S 5/4031 372/98 |
| 2006/0045158 A1* | 3/2006 | Li | H01S 5/405 372/50.12 |
| 2006/0182445 A1 | 8/2006 | Lee et al. | |
| 2008/0044128 A1 | 2/2008 | Kish et al. | |
| 2008/0310470 A1 | 12/2008 | Ooi et al. | |
| 2009/0032690 A1 | 2/2009 | Modavis | |
| 2009/0103580 A1* | 4/2009 | Farmer | H01S 5/02476 372/50.12 |
| 2013/0235441 A1* | 9/2013 | Davis | G02B 1/005 359/204.4 |
| 2014/0029943 A1 | 1/2014 | Mathai et al. | |
| 2014/0263971 A1* | 9/2014 | Karlsen | H01S 5/0014 250/206 |
| 2016/0224750 A1 | 8/2016 | Kethman et al. | |
| 2017/0164878 A1 | 6/2017 | Connor | |
| 2017/0205632 A1* | 7/2017 | Zhou | G02B 27/1006 |
| 2017/0328772 A1 | 11/2017 | Wijbrans et al. | |

(56) References Cited

U.S. PATENT DOCUMENTS

| | | | |
|---|---|---|---|
| 2018/0059552 A1* | 3/2018 | Pandey | G03F 7/70191 |
| 2018/0183214 A1* | 6/2018 | Dawson | H01S 5/02255 |
| 2019/0265491 A1* | 8/2019 | Zhou | G02B 27/1006 |
| 2019/0339468 A1 | 11/2019 | Evans | |
| 2019/0342009 A1 | 11/2019 | Evans | |
| 2019/0342010 A1 | 11/2019 | Evans et al. | |
| 2019/0377135 A1 | 12/2019 | Mansouri et al. | |
| 2020/0152615 A1 | 5/2020 | Krasulick et al. | |
| 2020/0244045 A1 | 7/2020 | Bismuto et al. | |
| 2020/0253547 A1 | 8/2020 | Harris et al. | |
| 2020/0309593 A1 | 10/2020 | Bismuto et al. | |
| 2020/0310010 A1* | 10/2020 | Zhou | G02B 27/1006 |
| 2020/0393615 A1 | 12/2020 | Bayn et al. | |
| 2021/0033805 A1 | 2/2021 | Bishop et al. | |
| 2022/0021179 A1 | 1/2022 | Lee et al. | |
| 2022/0221649 A1 | 7/2022 | Sakamoto et al. | |
| 2023/0011177 A1 | 1/2023 | Arbore | |
| 2023/0012376 A1 | 1/2023 | Arbore et al. | |

FOREIGN PATENT DOCUMENTS

| | | |
|---|---|---|
| JP | H07297324 | 11/1995 |
| JP | 2008262118 | 10/2008 |
| WO | WO 01/014929 | 3/2001 |
| WO | WO 04/031824 | 4/2004 |
| WO | WO 05/091036 | 9/2005 |
| WO | WO 11/090274 | 7/2011 |
| WO | WO 14/141451 | 9/2014 |
| WO | WO 17/040431 | 3/2017 |
| WO | WO 17/184420 | 10/2017 |
| WO | WO 17/184423 | 10/2017 |
| WO | WO 19/152990 | 8/2019 |
| WO | WO 20/086744 | 4/2020 |
| WO | WO 20/106974 | 5/2020 |
| WO | WO 20/240796 | 12/2020 |
| WO | WO 21/116766 | 6/2021 |

OTHER PUBLICATIONS

U.S. Appl. No. 18/079,672, filed Dec. 12, 2022, Bismuto et al.
U.S. Appl. No. 18/121,427, filed Mar. 14, 2023, Pelc et al.
U.S. Appl. No. 17/859,813, filed Jul. 7, 2022, Arbore.
U.S. Appl. No. 17/859,912, filed Jul. 7, 2022, Arbore et al.
Bogaerts, et al., "Off-Chip Coupling," *Handbook of Silicon Photonics*, CRC Press, Apr. 2013, 43 pages.
Chang et al., "A Comb-Drive Actuator Driven by Capacitively-Coupled-Power," *Sensors*, 2012, pp. 10881-10889.
Dhoore et al., "Novel adiabatic tapered couplers for active III-V/SOI devices fabricated through transfer printing," Ghent University, Belgium, Optical Society of America, 2016, 16 pages.
He et al., "Integrated Polarization Compensator for WDM Waveguide Demultiplexers," *IEEE Photonics Technology Letters* vol. 11, No. 2, Feb. 1999, pp. 224-226.
Holmström et al., "MEMS Laser Scanners: A Review," *Journal of Microelectromechanical Systems*, vol. 23, No. 2, 2014, pp. 259-275.
Komljenovic et al., "Photonic Integrated Circuits Using Heterogeneous Integration on Silicon," Proceedings of the IEEE 2018, pp. 1-12.
Lapedus, "Electroplating IC Packages—Tooling challenges increase as advanced packaging ramps up," *Semiconductor Engineering*, https://semiengineering.com/electroplating-ic-packages, Apr. 10, 2017, 22 pages.
Materials and Processes for Electronic Applications, Series Editor: James J. Licari, AvanTeco, Whittier, California, Elsevier Inc., 2009, 20 pages.
Milanovic et al., "Compact MEMS Mirror Based Q-Switch Module for Pulse-on-demand Laser Range Finders," presented at SPIE Conference on MOEMS and Miniaturized Systems XIV, San Francisco, California, 2015, 7 pages.
Schiappelli et al., "Efficient fiber-to-waveguide coupling by a lens on the end of the optical fiber fabricated by focused ion beam milling," *Microelectronic Engineering*, 73-74, 2004, pp. 397-404.
Tsai et al., "A Laminate Cantilever Waveguide Optical Switch," 2012, downloaded Sep. 19, 2021 from IEEE Xplore, pp. 203-207.
Worhoff et al., "Flip-chip assembly for photonic circuits," MESA+ Research Institute, University of Twente, Integrated Optical MicroSystems Group, The Netherlands, 12 pages.
Gonzalez-Sanchez et al., "Capacitive Sensing for Non-Invasive Breathing and Heart Monitoring in Non-Restrained, Non-Sedated Laboratory Mice," Sensors 2016, vol. 16, No. 1052, pp. 1-16.
Kybartas et al., "Capacitive Sensor for Respiratory Monitoring," Conference "Biomedical Engineering," Nov. 2015, 6 pages.

\* cited by examiner

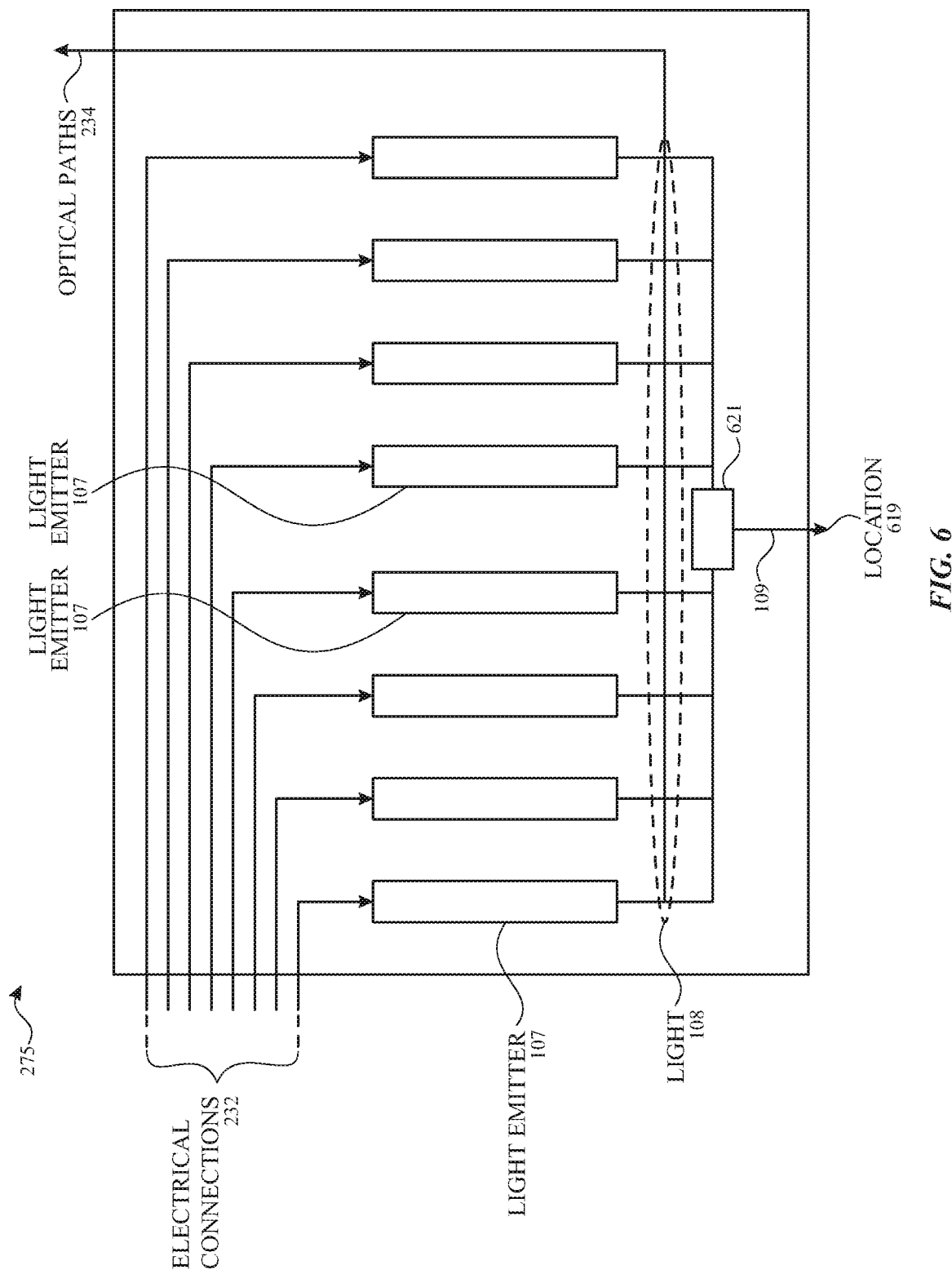

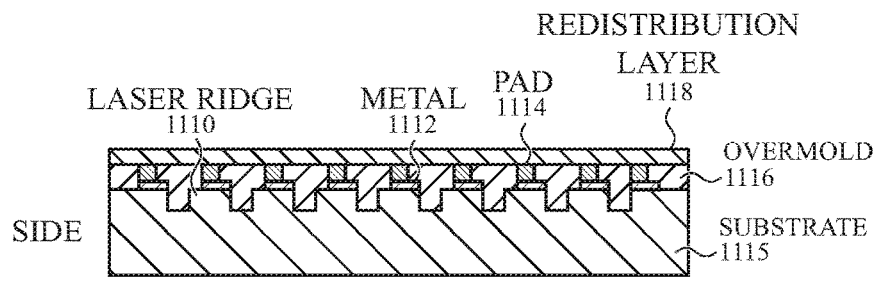
*FIG. 11F*
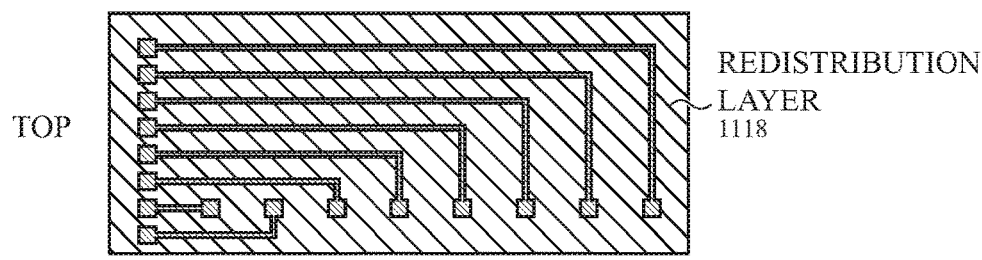
*FIG. 11G*
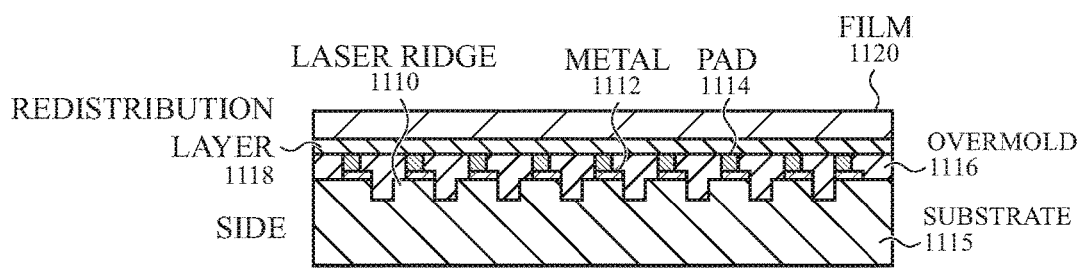
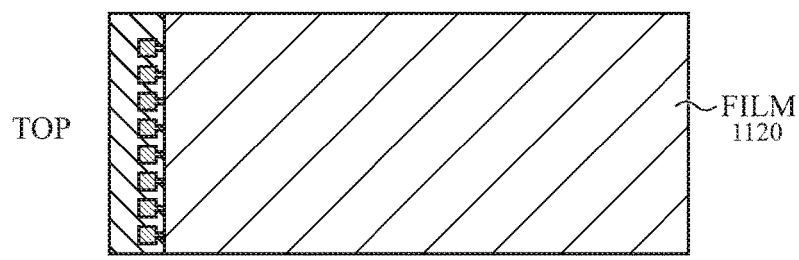
*FIG. 11H*

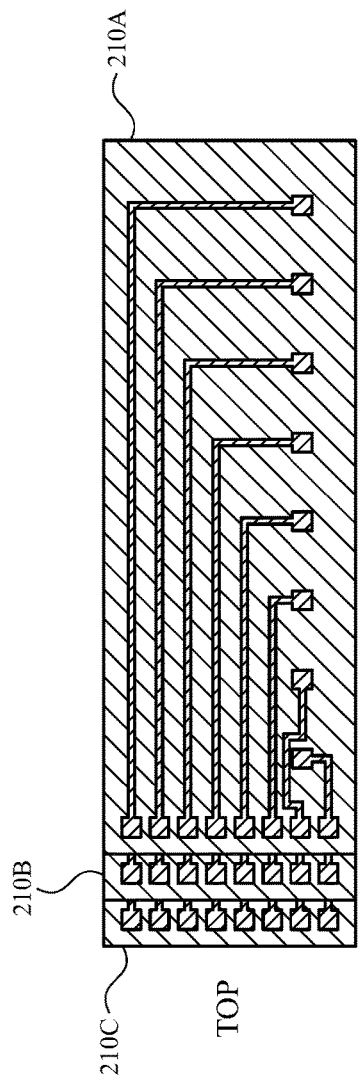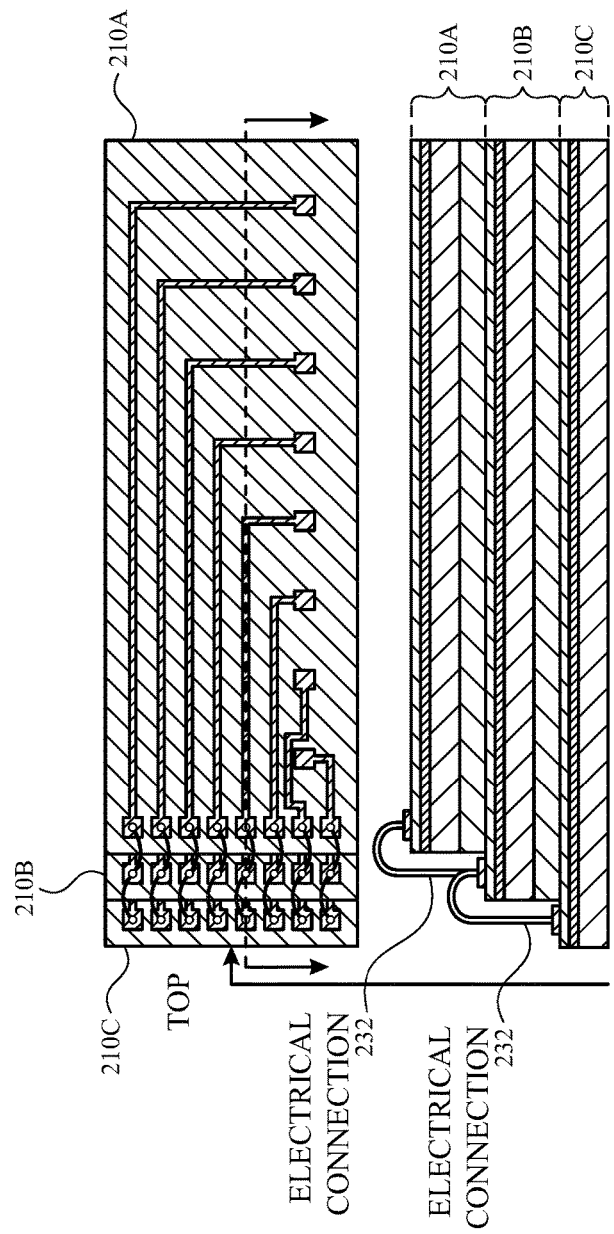

PHOTONICS ASSEMBLY WITH A PHOTONICS DIE STACK

CROSS-REFERENCE TO RELATED APPLICATION

This application is a nonprovisional of and claims the benefit under 36 U.S.C. § 119(e) of U.S. Provisional Patent Application No. 62/897,647, filed Sep. 9, 2019, and entitled "Stacked Photonics Integrated Circuit," the contents of which are incorporated herein by reference as if fully disclosed herein.

FIELD

This disclosure relates generally to photonics architectures packaged into a portable electronic device and, more specifically, to a photonics assembly with photonics dies arranged in a stack.

BACKGROUND

Photonics devices may be used for generating, processing, sensing, and/or outputting light. They may be utilized in many fields of endeavor, such as telecommunications, information processing, and medical fields, and may be employed in various devices such as bar code scanners, surgical endoscopes, photonic gyroscopes, and spectrometers. The architectures of these systems may include multiple components and circuitry which may affect the size of the device into which they are incorporated.

Due to the trend of creating ever smaller, thinner, and more compact electronic devices, the emphasis on the size and thickness of various components inside of the electronic device has increased. In some examples, a particular size of the electronic device is targeted and each component within the electronic device is given a maximum allowable form factor in order to support integration into the device. For example, a maximum area and/or thickness that the component may occupy in the electronic device may be limited. In some examples, integrating a photonics circuit into a particular device may be difficult due to the size constraints and limited area the photonics circuits may be allowed to occupy.

SUMMARY

Embodiments of the systems, devices, methods, and apparatuses described in the present disclosure are directed to stacked photonics dies. Also described are systems, devices, methods, and apparatuses directed to stackable photonics dies which may emit and detect light. Additionally, the photonics dies may have different functionalities and the dies may be modularly configured in a photonics assembly.

In some examples, the present disclosure describes a photonics system. The photonics system may include a set of photonics dies arranged in an offset vertical stack, each photonics die in a different plane than each of the other photonics dies. The photonics dies may include a first light emitter configured to emit first light in a first wavelength range, a second light emitter configured to emit second light in a second wavelength range that is different than the first wavelength range, an optical element configured to receive and collimate the first light and the second light into collimated light, and a mirror configured to receive the collimated light from the optical element and reflect the collimated light received from the optical element. Each of the set of photonics dies may be overlapping and offset in a first direction from all adjacent photonics dies and each of the set of photonics dies may emit light in a second direction that is orthogonal to the first direction. The photonics system may also include an optical element configured to detect light emitted by one or more of the photonics dies of the stack, where the light may be detected for each individual die emitting at different times, or the light may be detected for light being emitted at approximately the same time by multiple photonics dies. In some examples, the optical element may detect light emitted by one or more photonics dies at different times or light emitted at the same time to perform wavelength locking or reference measurements for the photonics dies of the stack. In some examples, the optical element routes optical signals between at least two of the set of photonics dies. The set of photonics dies may include a detector configured to monitor at least one of the first or second light emitted by at least one of the first or second light emitters.

In some examples, the photonics system may include an aperture structure configured to receive the collimated and reflected light from the mirror, and the aperture structure may include a first section that is at least partially optically transparent and a second section that is at least partially optically opaque. In some examples, the photonics system may include a prism configured to receive the collimated light from the optical element and reflect the collimated light received from the optical element. In some examples, the optical element may be a first optical element and the photonics system may include a second optical element configured to receive the collimated light from the first optical element and to redirect the collimated light to the mirror. In some examples, the optical element may include an array of cylindrical microlenses, and each cylindrical microlens is configured to receive the first light from a unique one of the set of photonics dies. In some examples, the photonics system may include a controllable actuator coupled to the optical element and configured to align the cylindrical microlens array. In some examples, the mirror may be a microelectromechanical systems (MEMS) mirror comprising a set of individually controlled reflectors.

In some examples, the present disclosure describes a method of operating a photonics system. The method may include emitting a first light having a first wavelength range from a first set of photonics dies, emitting a second light having a second wavelength range from a second set of photonics dies, receiving, by a first optical element, the first light and the second light, receiving, by a second optical element, the first light and the second light, and receiving, by a mirror, the first light and the second light from the second optical element. In some examples, the second optical element is configured to redirect the first and second wavelength ranges of light, and the first set of photonics dies and the second set of photonics dies are arranged in an offset stack such that each of the first set of photonics dies and the second set of photonics dies is laterally offset from every adjacent one of the first set of photonics dies and the second set of photonics dies. In some examples of the method, the first light is emitted at a first time and the second light is emitted at a second time that is different from the first time.

In some examples, the method may also include receiving, by an aperture structure, the first light and the second light from the mirror, and the aperture structure may include a first section that is at least partially optically transparent and a second section that is at least partially optically opaque. In some examples, the method may include receiving, by the mirror, one or more control signals from a controller, and adjusting a position of the mirror based on the one or more control signals. In some examples, the method may also include adjusting the position of the mirror at the first time such that the first wavelength range of light does not pass through the first section of the aperture structure.

In some examples, the method may include monitoring, by a detector coupled to the set of photonics dies, the first light and the second light, determining whether a property of the first light or the second light meets a criterion and, in the event the first light or the second light meets the criterion, adjusting the position of the mirror such that the first light and the second light passes through a first region of the aperture structure. In some examples, the method may include receiving, by an actuator, a control signal, and, in response to receiving the control signal, actuating the actuator in order to align the first optical element with the light emitted from at least one of the photonics dies of the sets of first and second photonics dies. In some examples, the method may include monitoring, by a detector coupled to the first and second sets of photonics dies, the first light and the second light.

In some examples, the present disclosure describes a photonics assembly. The photonics assembly may include a first photonics die including a first light emitter configured to emit light along a light path, a second photonics die offset in a first direction from, and stacked below, the first photonics die, the second photonics die including a second light emitter configured to emit light along the light path, an optical element configured to receive light from the first and second light emitters along the light path, and further configured to collimate the received light, and an aperture structure configured to receive light from the optical element along the light path, where the light path is in a second direction that is perpendicular to the first direction. In some examples, the photonics assembly may include a second optical element configured to receive collimated light from the optical element and redirect the light to the aperture structure. In some examples, the photonics assembly may include a third photonics die offset in the first direction from, and stacked above, the first photonics die where the third photonics dies is configured to receive light from the first photonics die, and the third photonics die is further configured to monitor the light from the first photonics die.

In addition to the example aspects and embodiments described above, further aspects and embodiments will become apparent by reference to the drawings and by study of the following description.

BRIEF DESCRIPTION OF THE DRAWINGS

FIG. 6 illustrates a light emitter layout on an epitaxial element of the photonics die.

FIGS. 11A-11J illustrate both side and top views of a photonics die with III-V materials.

Figure 1:
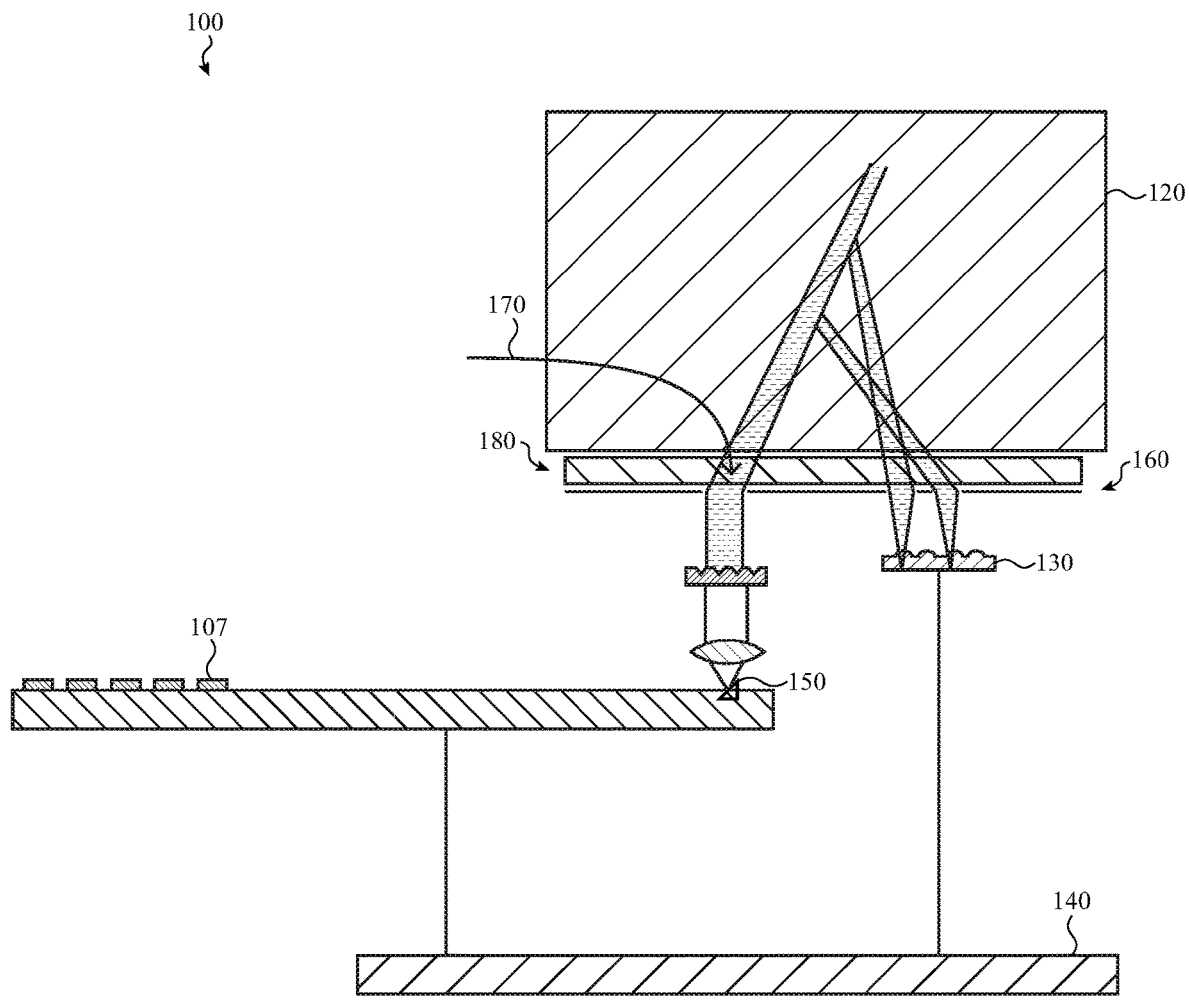
FIG. 1 illustrates one example of a photonics assembly.

The use of cross-hatching or shading in the accompanying figures is generally provided to clarify the boundaries between adjacent elements and also to facilitate legibility of the figures. Accordingly, neither the presence nor the absence of cross-hatching or shading conveys or indicates any preference or requirement for particular materials, material properties, element proportions, element dimensions, commonalities of similarly illustrated elements, or any other characteristic, attribute, or property for any element illustrated in the accompanying figures.

Additionally, it should be understood that the proportions and dimensions (either relative or absolute) of the various features and elements (and collections and groupings thereof) and the boundaries, separations, and positional relationships presented between them, are provided in the accompanying figures merely to facilitate an understanding of the various embodiments described herein and, accordingly, may not necessarily be presented or illustrated to scale, and are not intended to indicate any preference or requirement for an illustrated embodiment to the exclusion of embodiments described with reference thereto.

DETAILED DESCRIPTION

Reference will now be made in detail to representative embodiments illustrated in the accompanying drawings. It should be understood that the following description is not intended to limit the embodiments to one preferred embodiment. To the contrary, it is intended to cover alternatives, modifications, and equivalents as can be included within the spirit and scope of the described embodiments as defined by the appended claims.

Generally noise, such as random or semi-random noise, may be present in various types of imaging systems and may cause unwanted modifications of a signal. In some examples, the noise in the imaging systems may be coherent noise. Noise may degrade images in systems such as medical ultrasound systems, radar systems, projection systems, or any coherent imaging system by causing graininess, granular patterns, or intensity patterns in the image. Some systems may produce signals with so much noise that it may be difficult to determine the measured signal. In some examples, coherent multipath-interference may be a noise source, one example of which may be speckle noise.

Because of the increasing emphasis on smaller, more compact electronic devices, the size and thickness of the components inside of the electronic device may be limited. In some examples, a particular size of the electronic device is targeted and each component within the electronic device is given a maximum form factor or area that the component may occupy within the electronic device. Accordingly, the physical configuration of the integrated circuit, such as a photonics integrated circuit and/or photonics assembly, may become increasingly important to the form factor of the device.

As discussed herein, photonics assemblies may be arranged in various configurations such that they may perform desired operations while being extremely compact in order to fit into relatively small spaces within electronics devices. A sample photonics assembly may include one or more photonics dies which may be arranged in an offset vertical stack. The photonics assembly may include photonics dies capable of emitting one or more wavelengths and/or one or more wavelength ranges of light. Each such photonics die also may be configured as a detector for monitoring properties of light emitted from a different photonics die. Because each of the photonics dies may perform different functions and may be modularly configured, the photonics assembly may have a collective functionality defined by individual capabilities of each die.

The offset vertical stack configuration of the photonics dies may partially expose a surface of each photonics die in the stack. The exposed surface of a photonics die may be used for electrical connections such as wire bonds and bond pads, and detecting and/or routing of optical signals, thus resulting in space savings and a smaller footprint for the stack.

The photonics assembly may include optical elements, such as a mirror and an aperture structure. The photonics dies may emit light to the optical elements, which may combine, collimate, and/or redirect the light to the aperture structure. The aperture structure may include a transparent region or opening configured to allow light to pass through the aperture structure, may direct or control the light launch position, and may include an opaque region configured to block light while the wavelength and/or power of the emitted light stabilizes. Although referred to herein as an "aperture structure", the aperture structure may be a layer with an opening which may be physically connected to or spaced apart from a photonics die, and this layer may control the emitting or receiving of stray or unwanted light.

These and other embodiments are discussed below with reference to FIGS. 1-13. However, those skilled in the art will readily appreciate that the detailed description given herein with respect to these Figures is for explanatory purposes only and should not be construed as limiting.

Directional terminology, such as "top", "bottom", "upper", "lower", "above", "below", "beneath", "front", "back", "over", "under", "left", "right", and so forth, is used with reference to the orientation of some of the components in some of the figures described below. Because components in various embodiments can be positioned in a number of different orientations, directional terminology is used for purposes of illustration only and is in no way limiting. The directional terminology is intended to be construed broadly, and therefore should not be interpreted to preclude components being oriented in different ways.

As used throughout this specification, a reference number without an alpha character following the reference number can refer to one or more of the corresponding references, the group of all references, or some of the references. For example, "210" can refer to any one of the photonics dies 210 (e.g., photonics die 210A, photonics die 210B, etc.), can refer to all of the photonics dies 210, or can refer to some of the photonics dies (e.g., both photonics die 210A and photonics die 210B) depending on the context in which it is used.

Overview of the Photonics Assembly

FIG. 1 illustrates an example photonics assembly which may include an interface 180, a light emitter 107, a detector 130, and a controller 140. The interface 180 can include an external surface (e.g., system interface 380 illustrated in FIG. 4A) of a device which can accommodate light transmission therethrough. In some examples, the photonics assembly 100 can include an aperture structure 160 including one or more regions (e.g., a transparent region 170, an opaque region, a translucent region, a reflective region, a region having a different refractive index than surrounding material, and so on) configured to shape one or more of the location(s), angle(s), and/or shape(s) of light exiting the photonics assembly 100. By limiting the location and/or angles of light entering a measured sample volume 120, the light incident on a measured sample volume 120, and/or exiting from a measured sample volume 120 can be selectively limited. Although depicted in FIG. 1, the measured sample volume 120 is not included in the photonics assembly 100. The terms "photonics assembly" and "photonics system" may be used interchangeably herein.

While operating the photonics assembly 100, the measured sample volume 120 can be located close to, or touching at least a portion of, the photonics assembly 100 (e.g., photonics system interface). The one or more light emitters 107 can be coupled to the controller 140. The controller 140 can send a signal (e.g., current or voltage waveform) to control the light emitters 107, which can emit light. The one or more light emitters 107 may be included in one or more epitaxial elements (not shown in FIG. 1), which, in turn, may be included in the photonics dies, which will be discussed in detail herein with reference to FIGS. 7A-7D. Discussions herein may reference the photonics dies emitting light, though it may be a light emitter that is part of the epitaxial element, which is then part of the photonics die that may be emitting light. As such, discussions of the photonics dies emitting light are understood to encompass a light emitter emitting light, so long as that light emitter is part of the photonics die.

Depending on the nature of the measured sample volume 120, light can penetrate into the measured sample volume 120 to reach one or more scattering sites and can return (e.g., reflect and/or scatter back) towards the photonics assembly 100 with a controlled path length. The return light that enters back into the photonics assembly 100 may be directed, collimated, focused, and/or magnified. The return light can be directed towards the detector 130. The detector 130 can detect the return light and can send an electrical signal indicative of the amount of detected light to the controller 140.

Additionally or alternatively, the light emitter 107 can optionally emit light towards the reference (not illustrated in FIG. 1). The reference can redirect light towards optics which may include, but are not limited to, a mirror, lenses, and/or a filter, and also may redirect light towards a sample with known optical properties. The optics may direct, collimate, focus, and/or magnify light towards the detector 130. The detector 130 can measure light reflected from the reference and can generate an electrical signal indicative of this reflected light for quality purposes. As illustrated in FIG. 1, the light emitter 107 emits light toward an outcoupler or mirror 150. In some examples, the light emitter 107 may emit light toward a prism.

The controller 140 can be configured to receive one or more electrical signals from the detector 130, and the controller 140 (or another processor) can determine the properties of a sample from the received electrical signals. In some instances, the detector 130 can receive at least two electrical signals, where one electrical signal can be indicative of light reflected/scattered from the measured sample volume 120, and another electrical signal can be indicative of light reflected/scattered from the reference. Additionally, the detector may be configured to transmit the electrical signals to the controller 140. In some examples, each of the different electrical signals can be a time-multiplexed signal. For example, each of the different electrical signals for the measured sample volume and the reference may alternate with one another at different points in time. In other instances, two or more electrical signals can be received by different detector pixels concurrently and each of the electrical signals may include information indicative of different light information such as wavelength and intensity.

Photonics Die Stack

Figure 2A:
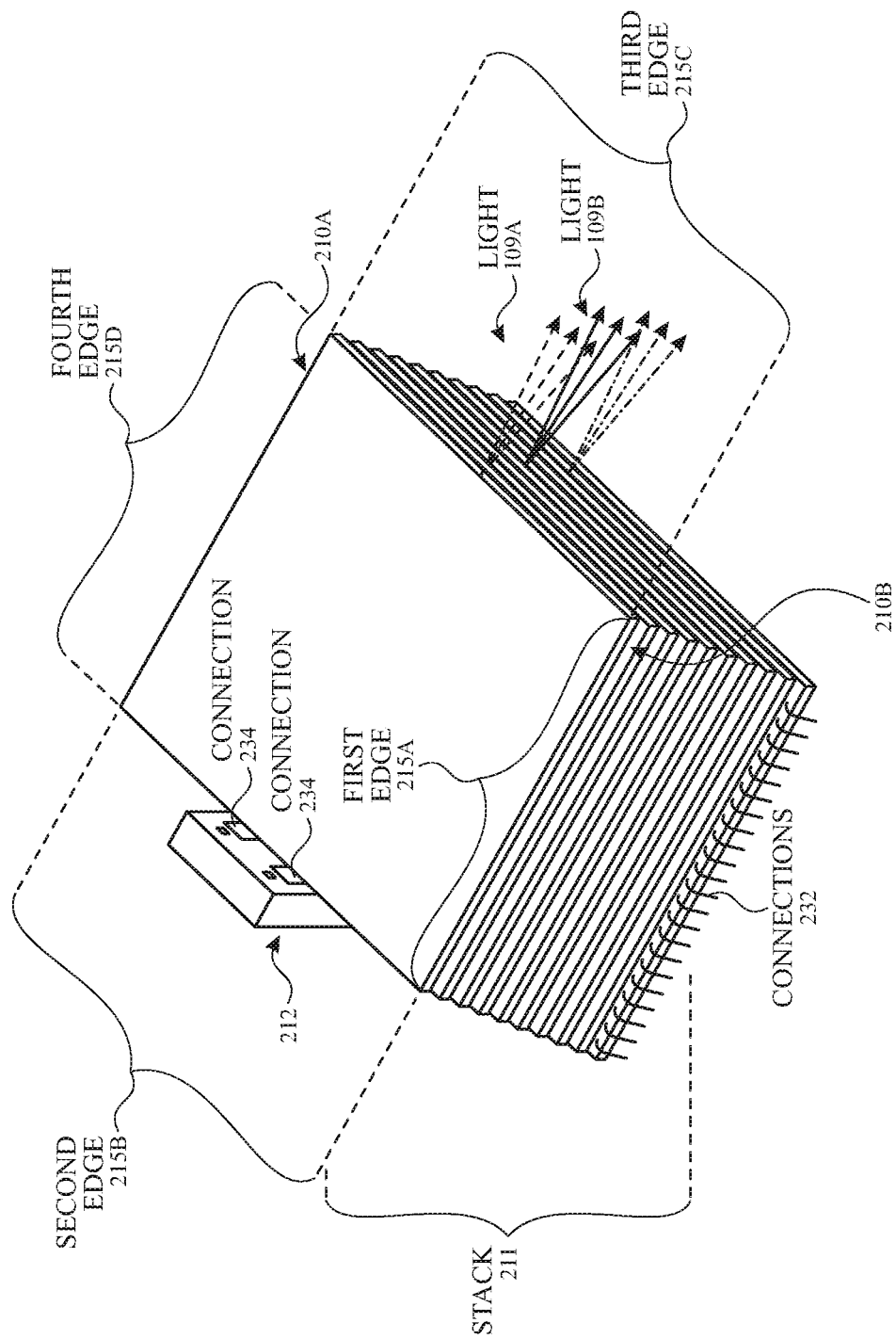
FIG. 2A illustrates a photonics die stack and an optical element.

FIG. 2A illustrates a photonics die stack and an optical element. The photonics die stack or stack 211 can take the form of photonics dies 210 arranged in a vertical offset stack, in which each of the individual photonics dies may be referred to with a separate element number such as 210A, 210B, 210C, and so forth. As discussed herein, the photonics dies may have different functionality from one another or the same functionality as one another depending on the application. FIG. 2A illustrates ten photonics dies 210 for explanatory purposes only; the photonics assembly 100 may include any number of photonics dies. As illustrated in FIG. 2A, each photonics die 210 can include a first edge 215A, a second edge 215B, a third edge 215C, and a fourth edge 215D. The first edge 215A may be the side of the photonics die from which the exposed surface of the photonics die 210 extends. The terms "photonics die stack" and "stack" may be used interchangeably herein. Additionally, as used herein, a stack may include multiple photonics dies, where the dies may be arranged in an aligned configuration or may be arranged such that each photonics die may be offset from the photonics dies positioned above and below it.

In FIG. 2A, a photonics die 210A may be stacked on top of and offset from photonics die 210B; each photonics die may be offset from the photonics dies immediately above and below it. Although in FIG. 2A the photonics dies of the stack are offset from one another in one direction, the photonics dies of the stack may be offset in more than one direction. For example, the photonics dies may also be offset from one another so that the second edges 215B are offset from one another in the stack 211 (e.g., leaving an exposed surface extending from multiple edges of the die in question). Additionally, the photonics dies are depicted in FIG. 2A as being the same size, but the photonics dies may be different sizes. Further, the photonics dies in FIG. 2A are illustrated as consistently offset in one direction, but every other photonics die may have aligned edges in the offset direction. For example, a first and a third photonics die may be aligned with one another, but a second photonics die that is located between the first and third photonics dies may be offset from the first and third photonics dies.

In some examples, a surface of each of the photonics dies may be exposed and bonded connections 232 and may be attached to one or more of the photonics dies 210. The bonded connections 232 may be used to electrically connect components of a respective photonics die 210 to a controller (not shown in FIG. 2A). In some examples, the bonded connections 232 may be wire bonds. Although FIG. 2A illustrates bonded connections 232 forming a connection between the photonics die in the bottom of stack 211 to a substrate, in some examples the bonded connections 232 may attach more than one photonics die to the substrate. In some examples, the bonded connections 232 from a given photonics die 210 may be electrically isolated from the bonded connections 232 of another photonics die 210.

In some examples, although not illustrated in FIG. 2A, one or more epitaxial elements may be bonded to the photonics die 210A, one or more epitaxial elements may be bonded to the photonics die 210B, and so forth. Additionally, one or more light emitters may be bonded to each of the epitaxial elements and the light emitters may emit a single wavelength or may emit a wavelength range. In this way, each of the photonics dies 210 may emit light at a wavelength or across a wavelength range, thus the stack 211 may provide light across a narrow wavelength range such as less than 200 nm or across a broad wavelength range such as 1400 nm-2400 nm. The configurations and epitaxial elements will be discussed with reference to FIGS. 7A-7D.

In some examples, the stack 211 may have all four edges aligned or approximately aligned in each direction. In this aligned configuration, the surfaces of the photonics dies along first edge 215A may not be exposed. To create connections, such as electrical connections from a photonics die 210 to another location (e.g., a substrate or another photonics die 210), vias may extend through one or more dies of the photonics assembly 100. Additionally or alternatively, the photonics assembly may include connections that are formed between the photonics dies; these connections may carry electrical signals, including common signals, or may be used to ground one or more dies.

Although FIG. 2A illustrates each of the photonics dies being offset from one another, in some examples, two or more photonics dies may be aligned in each direction and offset from the other photonics dies. In some examples, the exposed surfaces of the photonics dies can be created by different sized or shaped photonics dies 210. For example, photonics die 210A may be smaller in one direction than photonics die 210B, which may result in part of the surface of photonics die 210B being exposed.

As previously described, each photonics die 210 can include a first edge 215A, a second edge 215B, a third edge 215C, and a fourth edge 215D. In some embodiments the second edge 215B (or any other edge), may be adjacent to the optical paths 234 of the optical element 212. The optical paths can be waveguides used for monitoring optical properties such as wavelengths of the light emitted by the photonics dies 210. In some examples, one or more of photonics dies 210 may be detectors employed to monitor these optical properties. For example, a single photonics die may include one or more detectors and/or one or more emitters. Accordingly, the stack 211 may include photonics dies 210 which may be light emitting photonics dies and/or detector photonics dies. In some examples, functionality may be divided between different photonics dies to provide a collective functionality of stack 211, thus allowing a modular and flexible stack design. In one example, the optical paths 234 can optically couple light from a light emitting photonics die 210A to a detector on the photonics die 210B. In another example, a light emitting photonics die 210A may emit a first wavelength range to a detector on photonics dies 210B and 210C, where the detector on photonics die 210B may be configured to detect wavelengths, and the detector on photonics die 210C may be configured to detect optical power.

In some embodiments, a third edge 215C of each photonics die 210 (or any other suitable edge) may transmit light 109 out of the stack 211. In some examples, the third edge 215C of at least two or more photonics dies 210 may be aligned or substantially aligned with one another. The emitted light 209 may be emitted from one or more photonics dies. As shown in FIG. 2A, photonics die 210A may emit light 109A which may be in approximately the same plane as photonics die 210A. Similarly, photonics die 210B may emit light 109B which may be in approximately the same plane as photonics die 210B. In some examples, the photonics die 210A plane may be approximately parallel to the photonics die 210B plane. Additionally, FIG. 2A illustrates three photonics dies emitting light 109 for explanatory purposes only, as any number of photonics dies may emit light 109.

In some examples, the stack may have a fourth edge 215D of adjacent photonics dies 210. The fourth edge 215D may be offset in a manner similar to first edge 215A, and may optionally include bonded connections 232, similar to the first edge 215A.

Figure 2B:
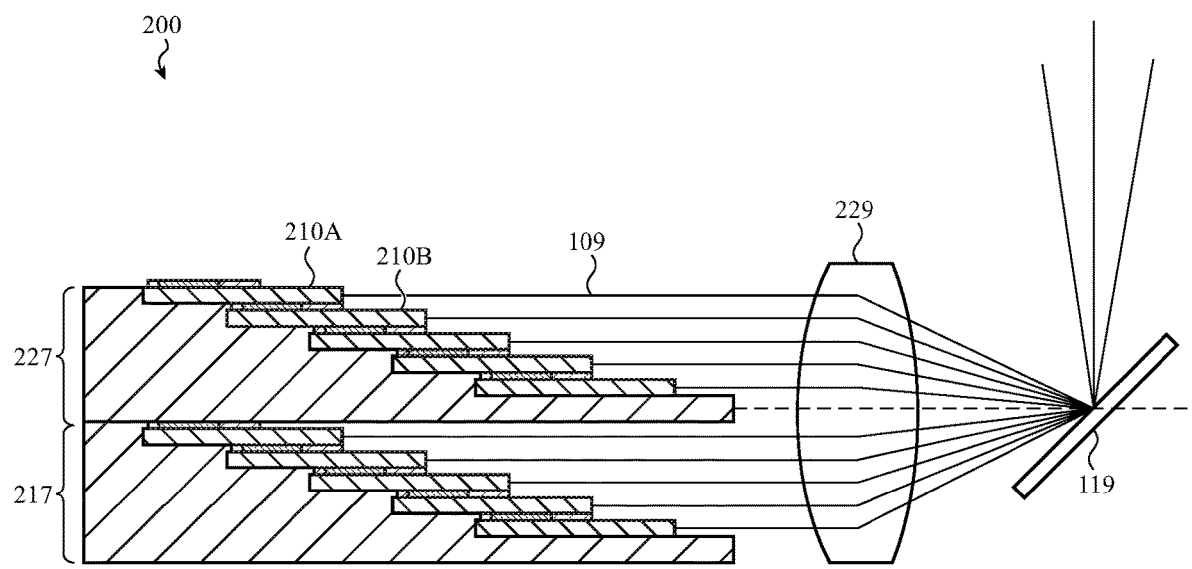
FIG. 2B illustrates multiple packages including photonics dies.

FIG. 2B illustrates multiple packages including photonics dies. In FIG. 2B, a photonics structure 200 may include a first package 227A which may be stacked above a second package 227B. The packages 227 may include photonics dies 210 which may emit light 109 toward optical element 229 and then to the mirror 150. The functionality of the mirror 150 was discussed with respect to FIG. 1. Although the mirror is used herein, a prism may also be used to perform a similar function as the mirror. In FIG. 2B, the light may be emitted in the same direction as the stack offset and from the first edge 215A of the stack 211, as opposed to the light being emitted out of the third edge 215C as discussed in FIG. 2A. The term "package" as used herein may include one or more photonics dies, a mounting substrate, die attach films, and so forth.

In FIG. 2B, the package 227 may include photonics dies 210 arranged in a vertical offset stack, in which each of the individual photonics dies may be referred to as 210A, 210B, and so forth. Package 277B is located below package 227A and may include the same components in the same configuration as package 227. FIG. 2B illustrates two packages for explanatory purposes only and the photonics system 200 may include any number of packages. The number of packages in a given embodiment may depend on a target form factor of the photonics circuitry and/or photonics system, which may depend at least in part on the form factor of the electronics device into which it will be incorporated.

In some examples, two separate packages may each include photonics dies with the same or different functionalities. The functionality of the photonics dies within each of the packages may depend on any number of factors such as, but not limited to, the wavelengths emitted by the photonics dies, the optical combiners or multiplexers, the optical switches, the waveguides, the optical power in a wavelength range, any combination thereof, and so forth. In some examples, two packages may each include a switch and five photonics dies. By including five photonics dies, the switch may select between each of the five photonics dies in the two packages faster than one package with a single switch and ten photonics dies. In another example of packages with photonics dies with different functionalities, each package may have five photonics dies, where each photonics die may emit a different wavelength range. For some applications the photonics assembly may need higher power in five wavelength ranges. In this example, two packages with five photonics dies per package, where the photonics dies within a package each emit a different wavelength range, may be more useful than a stack of ten different photonics dies where each photonics die emits one of ten different wavelength ranges. In some examples, the emitted wavelength ranges may be 1400 nm-2400 nm. Five and ten photonics dies per package are discussed for explanatory purposes only and, in other embodiments, a package may include any number of photonics dies.

Figure 2C:
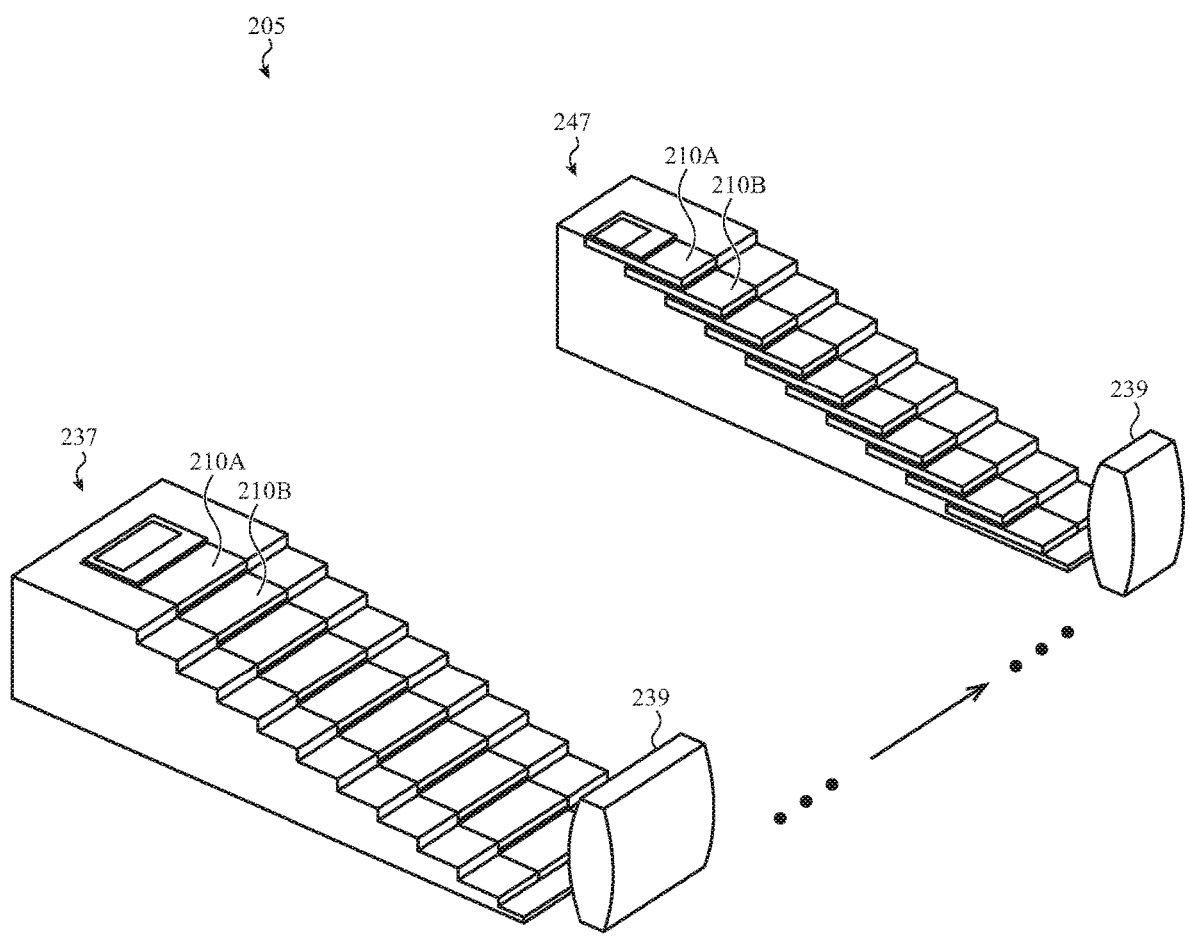
FIG. 2C illustrates multiple packages including photonics dies.

FIG. 2C illustrates multiple packages including photonics dies. In FIG. 2C, a photonics structure 205 may include a first package 237 which may be adjacent to a second package 247. The packages 237 and 247 may include photonics dies 210A, 210B, . . . 210N, which may emit light (light not illustrated in FIG. 2C) toward optical elements 239. Similar to FIG. 2B, the light in FIG. 2C may be emitted in the same direction as the stack offset.

Similar to the packages described with respect to FIG. 2B, the package 237 may include photonics dies 210 arranged in a vertical offset pattern as discussed above. Additionally, package 247 may include multiple photonics dies 210 arranged in a vertical offset pattern, similar to package 237.

FIG. 2C illustrates two packages for explanatory purposes only; the photonics structure 205 may include any number of packages. Similar to FIG. 2B, the number of packages which may be adjacent to one another may depend on a target form factor of the photonics circuitry and/or photonics assembly, which may depend at least in part on the form factor of the electronics device into which it will be incorporated. In some examples, the packages may be stacked side by side and above one another and may be configured in any appropriate arrangement which may include aligning the packages with one another vertically, horizontally, or offsetting the packages relative to one another in any direction.

Figure 3A:
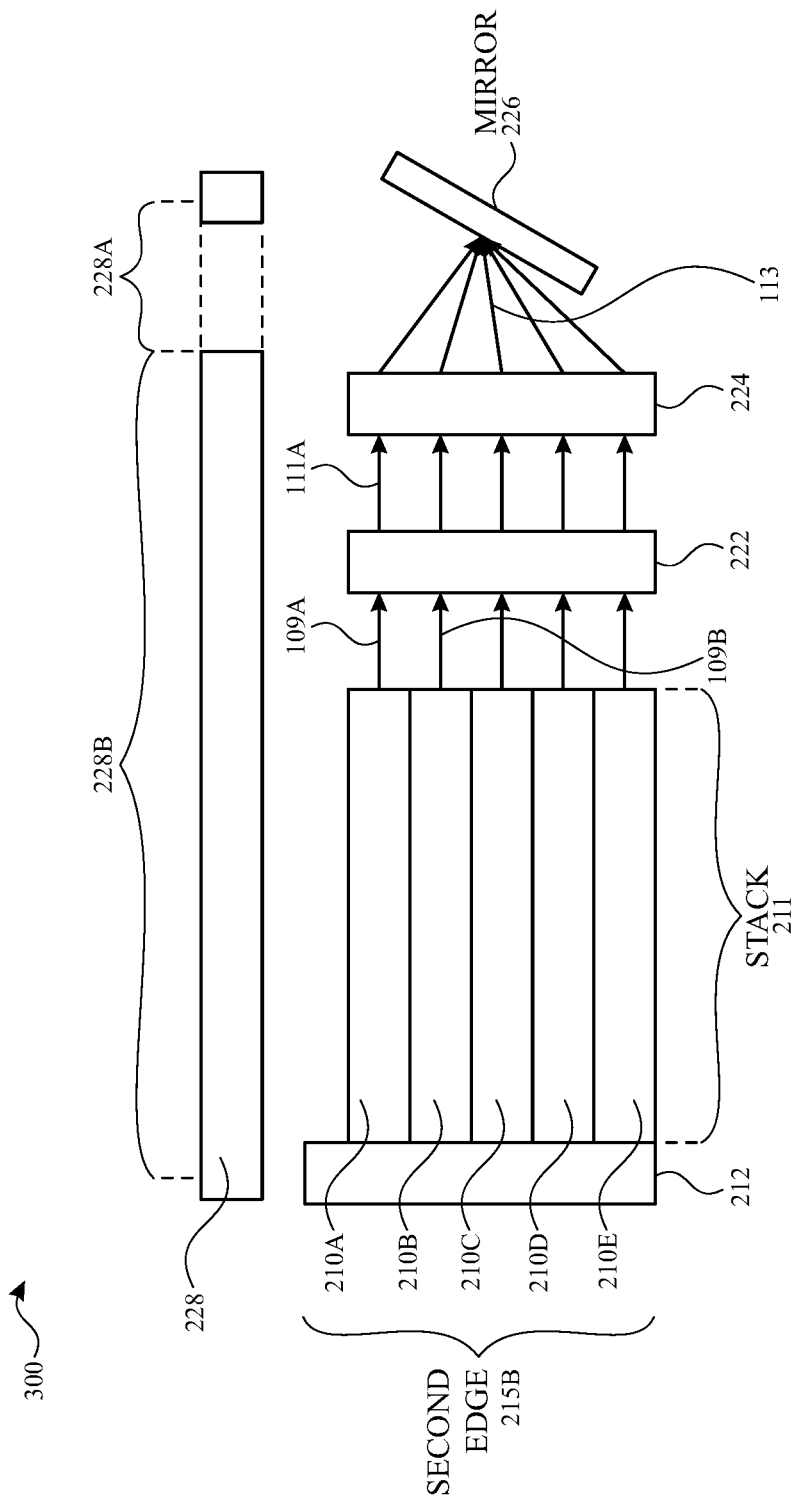
FIG. 3A illustrates a cross-sectional view of a partial photonics assembly.

FIG. 3A illustrates a cross-sectional view of a partial photonics assembly. FIG. 3A is a cross-section taken normal to a second edge 215B of a stack of photonics dies with an optical element. Additionally, due to the direction of the cross section of the photonics dies, the offset of the stack is not apparent in FIG. 3A. Structure 300 can include multiple photonics dies 210 incorporated into a stack 211. As illustrated in FIG. 3A, the photonics dies can be arranged in a stacked configuration, where photonics die 210A may be positioned above photonics die 210B, photonics die 210B may be positioned above photonics die 210C, and so forth.

In some examples, the photonics die 210A can be configured to emit light 109A having a first wavelength or a first wavelength range; the photonics die 210B can be configured to emit light 109B including a second wavelength or a second wavelength range; photonics die 210C can be configured to emit light including a third wavelength or a third wavelength range; and so forth. In this manner, each photonics die 210 of the structure 300 can be configured to emit light having a unique wavelength or unique wavelength ranges.

In some examples, the photonics die 210A may include one or more epitaxial elements. Additionally, one or more light emitters may be bonded to each of the epitaxial elements. Thus, the wavelength range of light emitted by the photonics die 210A depends on the number of light emitters and the number of epitaxial elements. In some examples, each epitaxial element may emit light over a wavelength range of 0.05 µm-0.075 µm. In some examples, each epitaxial element may emit light over a narrow wavelength range of approximately 0.066 µm.

In some examples, the combined wavelength range of multiple photonics dies 210 may output or provide a broadband wavelength range, which may be a set of emitted broadband wavelengths over an approximate range of 1 µm. In some examples, the 1 µm emitted broadband wavelength may be in the "broadband" range of approximately 1.0 µm to 3.0 µm. Accordingly, embodiments described herein may operate over, or employ, an operating range that may correspond to, or be encompassed in, a broadband wavelength range. Examples of such operating ranges include 1.0 µm-2.0 µm, 1.3 µm-2.3 µm, 1.4 µm-2.4 µm, 1.5 µm-2.5 µm, and so forth. Although specific wavelength ranges may be discussed, any appropriate wavelength or wavelength range may be emitted by the photonics elements described herein. Also as used herein, a "narrow wavelength range" generally refers to less than 0.07 µm. Although specific wavelength ranges of light have been discussed, any appropriate wavelength or wavelength range may be emitted by the photonics dies depending on the use case.

The structure 300 may also include any or all of a light combining optical element 222, a light directing optical element 224, a mirror 226, an aperture structure 228, and an optical element 212. Although the light combining optical element 222 and light directing optical element 224 are illustrated in FIG. 3A as two separate elements, in some examples, the functions of these two elements may be combined into one optical element such as a toroidal optical element. Additionally, the light combining optical element 222 is illustrated as a single optical element but the function may be performed by multiple optical elements. For example, the light 109 received from the stack 211 may be combined by a combining optical element and then collimated by a collimating element, and thus two optical elements may perform the functions of the single light combining optical element 222. Similarly, while the light directing optical element 224 is depicted as a single optical element, two or more lenses may be used to redirect the light to the mirror. In some examples, a prism may perform a similar function as the mirror. Additionally, in some examples, the light combining optical element may also function as a light coupling element. In further examples, the light directing optical element may be any optical element that redirects light such as lenses with negative power or positive power.

In some examples, the photonics dies 210 may emit light 109 at an approximately normal angle of incidence to the receiving surface of the light combining optical element 222. In FIG. 3A, the light combining optical element 222 may receive light 109 emitted by the photonics dies 210 of the stack 211. In some examples, the light combining optical element 222 can be configured to combine light from multiple photonics dies 210 of the stack 211. The light combining optical element 222 may be further configured to collimate and/or combine light received from the stack 211.

The light combining optical element 222 may pass light 111A to the light directing optical element 224. As illustrated in FIG. 3A, the light directing optical element 224 can be configured to receive light 111A from the light combining optical element 222. In some examples, the light directing optical element 224 may direct or steer the light 113 to the mirror 226.

The mirror 226 may receive light from the light directing optical element 224 and redirect light to the aperture structure 228. In some examples, the mirror 226 can be arranged such that its reflecting plane is non-perpendicular and non-parallel to the plane of the photonics dies 210. In some instances, the aperture structure 228 may be located above the stack 211. In some embodiments, the aperture structure 228 may have a plane that is parallel or close to parallel (e.g., within 5 degrees) from the plane of at least one photonics die 210.

The aperture structure 228 can include a transparent region 228A and an opaque region 228B. The transparent region 228A may allow light 113 to pass through. The transparent region(s) may include material and/or an opening and may be at least partially transparent (for example, permitting at least 50% of light to pass therethrough). The opaque region 228B may not allow incident light to pass through. In some examples, the opaque region 228B may be configured to absorb or block incident light.

In some examples, light may pass through the transparent region 228A of the aperture structure 228 and form a "stripe" of light. The stripe of light may be formed due to the varying positions of the photonics dies 210 and/or the varying positions of the one or more light emitters within each photonics die 210. Multiple light emitters in a photonics die are discussed with reference to FIG. 6. In some examples, each photonics die position can be associated with light with one or more unique wavelengths or unique wavelength ranges.

In some examples, the mirror 226 can be a microelectromechanical (MEMS) mirror. The MEMS mirror may adjust the angle of light reflected from the mirror 226. For example, the MEMS mirror can be controlled by a controller (not shown in FIG. 3A) such that the light provided by the mirror 226 may be incident on, or pass through, a specific region of the aperture structure 228. The mirror may receive one or more control signals from the controller and may adjust its position based on the control signal(s). In some examples, the mirror 226 may be used to time sequentially combine or multiplex individual light outputs from the corresponding photonics die so that all the light is directed to and entering the sample at approximately the same angle and position.

The structure 300 may also include an optical element 212. In some examples, the optical element 212 may be located in the stack 211. When located in the stack, the optical element may have one or more functions that are different from the photonics dies 210 in the stack. In some examples, the optical element 212 may be a detector. The detector may receive and detect light from each photonics die in the stack 211. The detector may be used for wavelength locking or reference measurements of the photonics dies in the stack 211.

For example, the photonics dies 210 can be configured to emit light, whereas the optical element 212 can be configured to route one or more optical signals from the photonics dies 210 included in the stack 211. The optical element 212 can include one or more connections (electrical, optical, or both) to one or more photonics dies 210. For example, optical signals can be routed from photonics die 210A through the optical element 212 to another photonics die 210B. The optical element 212 may also route signals to an off-chip die (not shown in FIG. 3A). In some examples, the off-chip die may be an off-chip detector which may be used for wavelength locking.

The broad wavelength range of light of the stack 211 may be separated into narrow wavelength ranges that are emitted by each photonics die in the stack 211, thus each photonics die may be unique and optimized for its respective narrow wavelength range. Examples of these unique factors of a photonics die 210 can include properties relating to antireflection coatings, narrow band passive photonics components (e.g., splitters, combiners/multiplexers, polarizers, and so forth), and process operations related to III-V integrations that are unique for particular material systems such as InP or GaSb, for example. In some examples, the photonics die 210A and/or the components of the photonics die 210A can be fabricated on different substrate types such as silicon, a III-V material like GaAs, ceramic, or any other appropriate substrate that may serve the purpose of mechanical, electrical, and optical support and/or routing. The different substrate types can be designed or selected to enhance certain performance characteristics such as wavelength of the respective photonics dies 210.

In some examples, a first photonics die 210A can be configured to measure one type of signal, and the second photonics die 210B can be configured to measure another type of signal. Additionally or alternatively, the photonics die 210C can be configured for calibration functions, such as wavelength monitoring. In this manner, the structure 300 can be a modular system, where the inclusion (or exclusion) of a given photonics die 210 can change the overall functionality of the device.

In some examples, at least one of the photonics dies 210 can have the same or redundant wavelength properties or optical functionality as another photonics die 210. Operating the system in this manner may be referred to herein as a "redundant mode". For example, two photonics dies 210A and 210B may emit light at the same wavelength or have the same wavelength range. By doing this, the system may have a redundant capability and employ either photonics die 210A or photonics die 210B to take a measurement at the first wavelength or in the first wavelength range. Thus, one or more components on photonics die 210A may not be concurrently operated with one or more components on photonics die 210B.

The system may also have the capability to increase the output power by using multiple photonics dies simultaneously. Operating the system in this manner may be referred to herein as a "power mode". The concurrent operation of both photonics dies may increase the output power of the emitted light at a given wavelength or in a given wavelength range. In some examples, more than two photonics dies may be operated concurrently. Concurrent operation can include starting the operation of the photonics dies at the same time, ending the operation of the photonics dies at the same time, or both.

In some examples, two or more photonics dies may be operated in a redundant mode and two or more other photonics dies may be operated in a power mode. For example, both of photonics die 210A and photonics die 210B can be configured in the redundant mode for first wavelengths or first wavelength ranges, and both of photonics die 210C and photonics die 210D can be configured in a power mode for second wavelengths or second wavelength ranges.

Figure 3B:
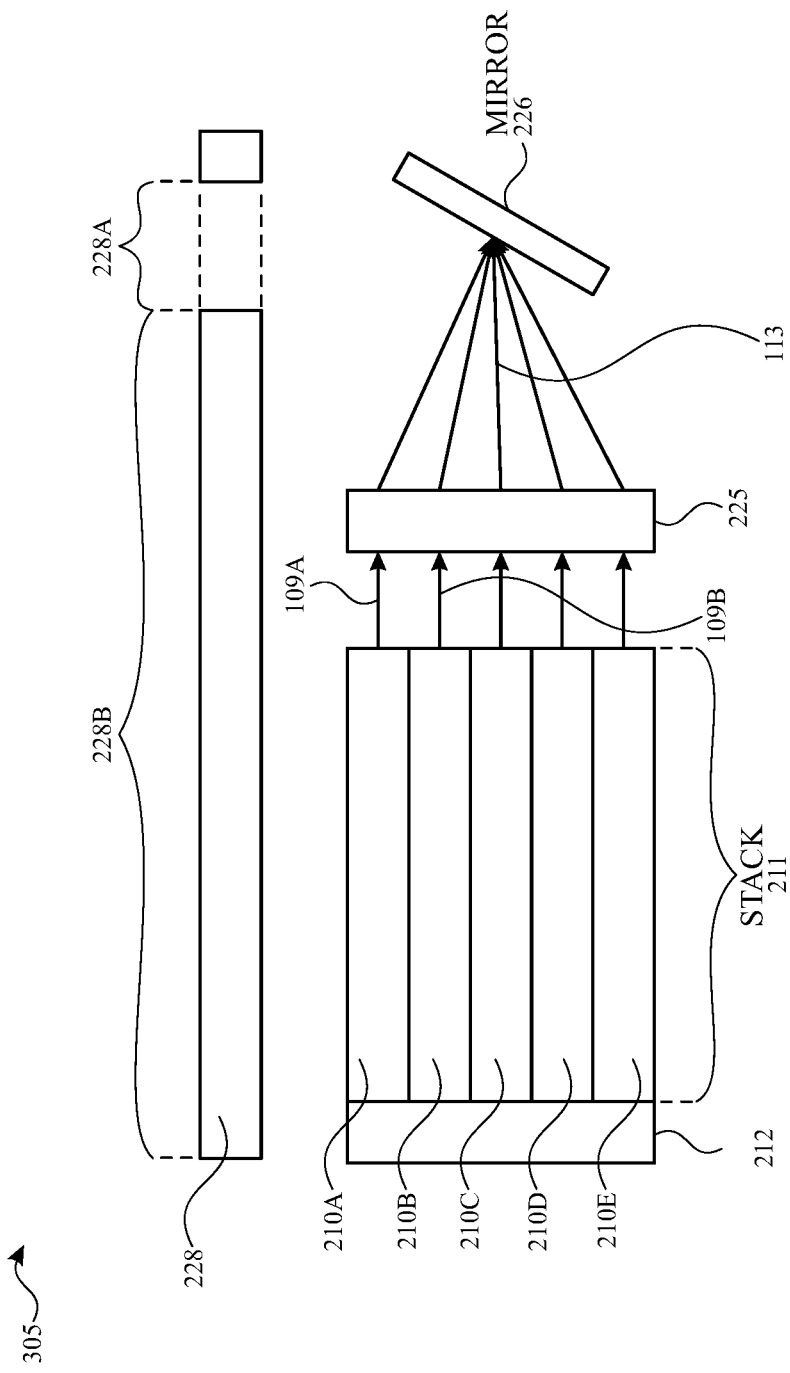
FIG. 3B illustrates a cross-sectional view of a partial photonics assembly.

FIG. 3B illustrates a cross-sectional view of a partial photonics assembly. The cross-sectional view of FIG. 3B is the same as that of FIG. 3A. The structure 305 of FIG. 3B is similar to the structure 300 of FIG. 3A, except the structure 305 of FIG. 3B includes a single light combining and directing optical element 225. The structure 305 can include multiple photonics dies 210, a stack 211, an optical element 212, a mirror 226, and an aperture structure 228 that may be similar to the components described with respect to the structure of FIG. 3A. Here, however, the structure may also include a light combining and directing optical element 225 to combine, collimate, and direct or steer light. The light combining and directing optical element 225 may be configured to receive light 109 from the stack 211. The received light may be combined, collimated, and/or directed or steered to provide light 113 to the mirror 226.

Figure 3C:
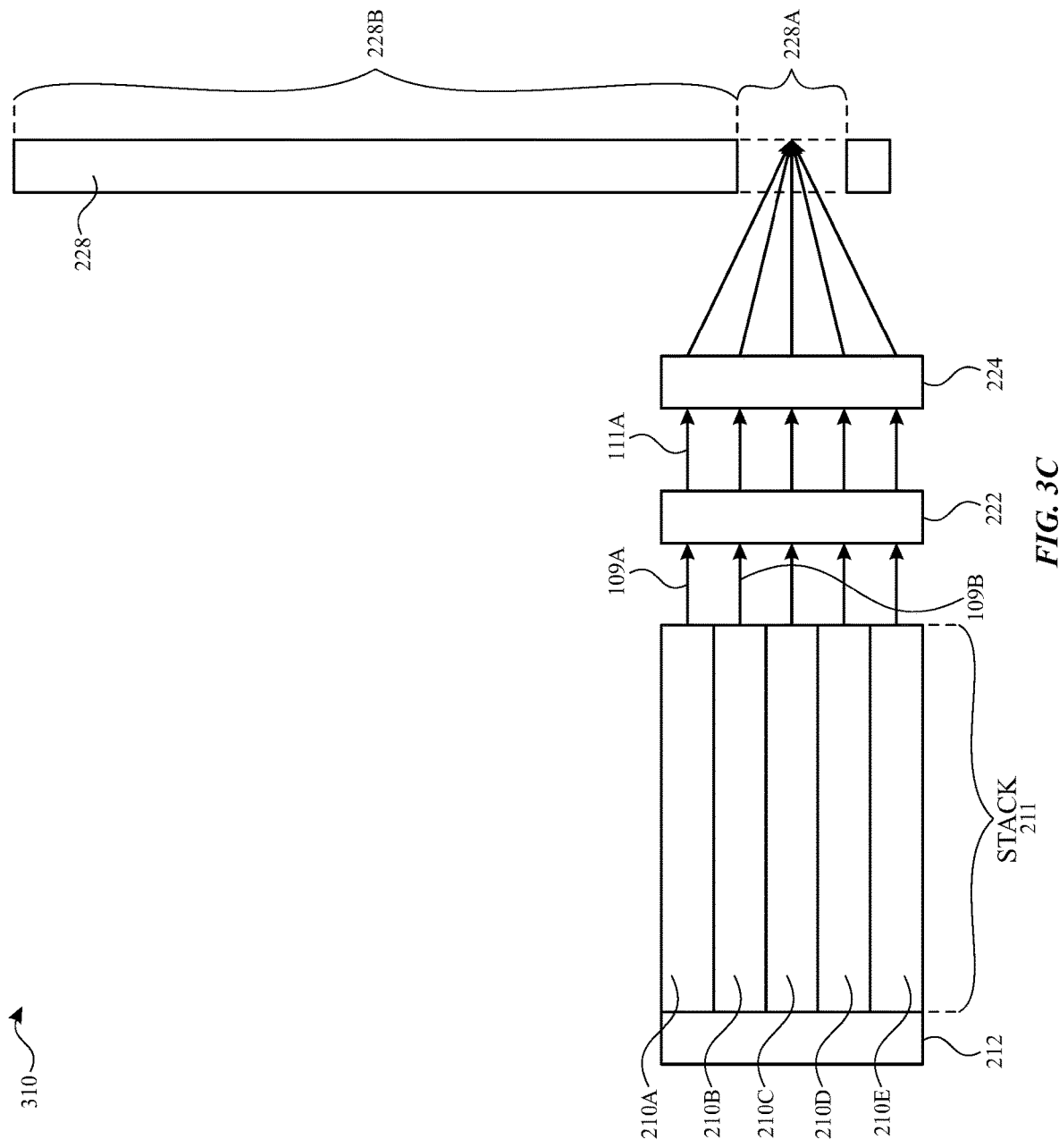
FIG. 3C illustrates a cross-sectional view of a partial photonics assembly.

FIG. 3C illustrates a cross-sectional view of a partial photonics assembly. The cross-sectional view of FIG. 3C is the same as that of FIGS. 3A and 3B. Structure 310 is generally similar to, and may include components that are the same as, structure 300 and/or structure 305 of FIGS. 3A and 3B, respectively. However, structure 310 may not include a mirror 226. Additionally, in some examples of FIG. 3C, the light combining optical element 222 can include multiple lenses which will be discussed in further detail in FIGS. 4A and 4B.

As illustrated in FIG. 3C, the structure 310 may have a light emitting edge (e.g., as illustrated in FIG. 2A as third edge 215C) which may direct light to the aperture structure 228 without the use of the mirror 226. The stack 211 may provide light 109 to the light combining optical element 222, which may in turn provide light 111A to the light directing optical element 224. The light directing optical element 224 may direct light to one or more regions, such as transparent region 228A of the aperture structure 228.

In other examples, the structure 310 may omit the aperture structure 228. For example, light may be launched directly into the sample after passing through light combining optical element 222 and light directing optical element 224 and without passing through region 228A of the aperture structure 228. In this way, the light may launch into the sample without multiplexing the light.

Figure 4A:
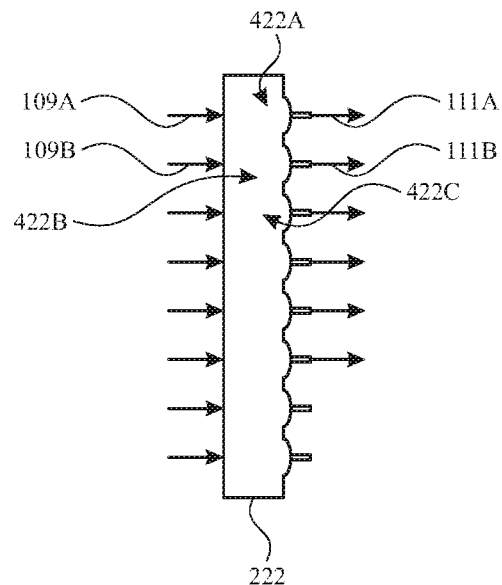
FIG. 4A illustrates a side view of a light combining optical element.

FIG. 4A illustrates a side view of a light combining optical element. In some examples, the light combining optical element 222 may include an array of fast-axis collimating lenses. In some examples, the collimating lenses can take the form of a cylindrical microlens array having multiple microlenses such as microlens 422A, microlens 422B, microlens 422C, and so forth. The terms "light combining optical element," "microlens array," and "microlenses" may be used interchangeably herein.

The light combining optical element 222 can receive light 109 emitted by one or more photonics dies of a stack; such dies and stacks were discussed with respect to previous figures. The light combining optical element 222 may then pass light 111 to the light directing optical element 224 shown in FIG. 3C.

In some examples, each microlens 422 of the light combining optical element 222 can be configured to receive light from a respective photonics die. That is, a first photonics die may emit light 109A which may be received by microlens 422A, a second photonics die may emit light 109B which may be received by microlens 422B, and so on. In some instances, the light combining optical element 222 may be adjustable and may move such that the light combining optical element 222 may be aligned so that each microlens 422 may receive light from a corresponding photonics die 210. In some examples, the individual microlenses 222, may not be attached to one another by a common substrate (not illustrated in FIG. 4A). In this example, each individual microlens 422 can be individually aligned to the light emitted from its respective photonics die 210.

Figure 4B:
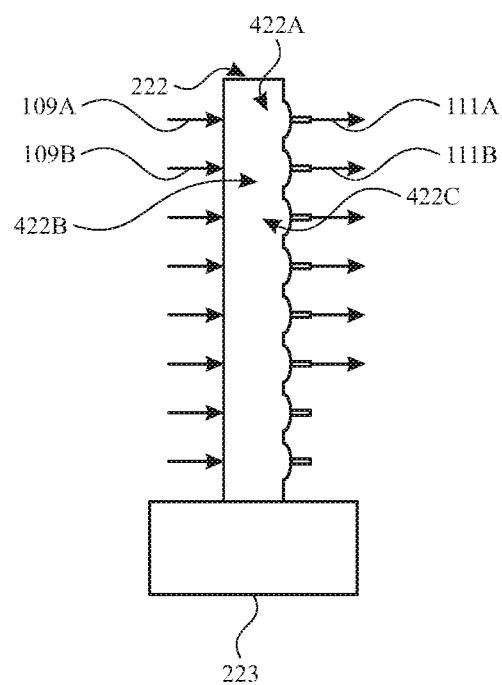
FIG. 4B illustrates a side view of a light combining optical element coupled to an actuator.

FIG. 4B illustrates a side view of a light combining optical element 222 coupled to an actuator 223. The light combining optical element 222 may be the same as, or similar to, the one described with respect to FIG. 4A. The actuator 223 can receive one or more control signals and move the microlenses 422 in response to such signals. In some examples, the actuator 223 may be a voice coil motor, a piezo-based motor, a shape memory alloy actuator, electrostatic MEMs, magnetic actuators, any combination thereof, and so forth. In some instances, the actuator 223 can move the microlenses 422 such that a specific microlens can be aligned with a targeted photonics die 210. For example, the targeted photonics die may emit light 109A. The actuator 223 can be configured to move the microlens 422 such that the maximum curvature point of microlens 422A can be aligned with the photonics die that emits light 109A. As another example, the targeted photonics die may, e.g., at a second time, be the photonics die that emits light 109B; and the actuator 223 can be configured to move the microlens 422B such that the maximum curvature point of microlenses 422B can be aligned with the emitted light 109B. This type of adjustment may be used when the pitch of the microlenses does not align with the emitted light of the photonics dies.

Although FIG. 4B illustrates the actuator 223 as coupled to the bottom of the microlens array 422, in some examples the actuator 223 may be coupled to one or more sides of the microlenses 422 for moving it one or more directions, such as parallel or perpendicular to the stack of photonics dies or to adjust the distance between the microlenses 422 and the stack of photonics dies. As another example, the actuator 223 can be configured to move in one or more directions to act, along with the light combining optical element 222, the light directing optical element 224, or both, as a moving diffuser for mitigating noise.

FIGS. 5A-5F illustrate a side view of components of a photonics die during various processing operations that result in the construction of a photonics die. Generally there are three implementations of integrating light emitters with the epitaxial element to provide a photonics die. The light emitter may be bonded and integrated into a silicon photonics system where the light emits through the silicon photonics system (such as propagating through a waveguide in the silicon photonics system) as discussed with reference to FIG. 6. Additionally, the light emitter may be bonded to a dummy substrate such as silicon or ceramic or any appropriate substrate as described with reference to FIGS. 5A-5F, where the substrate provides electrical connections and mechanical and thermal advantages, but the light emitter emits light directly into free space. Further, the light emitter may use III-V material only with no substrate, where the III-V material is arranged as a stack without using any other substrates as described in FIGS. 11-13.

Figure 5A:
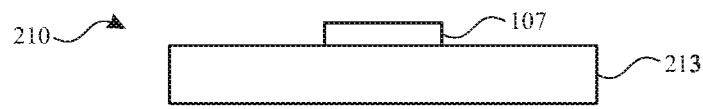
FIG. 5A illustrates a side view of components of a photonics die during processing.
Figure 5B:
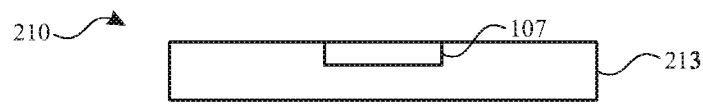
FIG. 5B illustrates a side view of components of a photonics die during processing.

As illustrated in FIG. 5A, a light emitting element 107 may be bonded on a substrate 213. The light emitting element 107 can be bonded on top of the substrate 213 such that the top of the light emitting element 107 protrudes from the substrate 213. Alternatively, a substrate cavity may be formed and the light emitting element 107 can be integrated into the substrate cavity such that the top of the light emitting element 107 does not protrude above the substrate 213, as illustrated in FIG. 5B. In some examples, the light emitting element 107 may be integrated into the substrate cavity so that the top of the light emitting element 107 partially protrudes above the substrate 213. In some examples and as previously discussed, the substrate 213 may be a silicon substrate or a silicon photonics system or the light emitting element may be a III-V material. In other examples, the photonics die may be a III-V material only which will be discussed here in FIGS. 11-13.

In FIG. 5B, a cavity can be formed in the substrate 213, and the light emitting element 107 can be recessed into the substrate 213 by being bonded in the cavity. In some examples, the light emitter 107 may be formed separately from the substrate 213 and then bonded thereto. For example, the light emitters 107 may be tested and selected based on their performance prior to being bonded to the substrate 213. In this manner, a given photonics die 210 may have pre-screened light emitters 107, which can lead to increased yields.

Figure 5C:
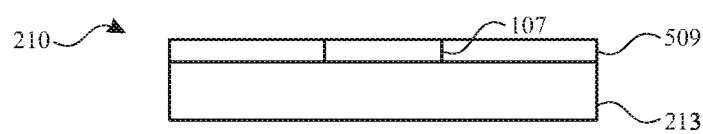
FIG. 5C illustrates a side view of components of a photonics die during processing.

FIG. 5C illustrates that an overmold 509 may be formed or deposited around the light emitting element 107 of FIG. 5A (or on top of the light emitting element 107 in the case of FIG. 5B), such that the top of the light emitting element 107 may be approximately coplanar with the top of the overmold 509, as shown in FIG. 5C. As another option, a portion of the substrate 213 may be cut, etched, machined away, or otherwise removed and the overmold material deposited on the remainder of the substrate; this may be done to the example photonics die illustrated in FIG. 5B, for example.

Figure 5D:
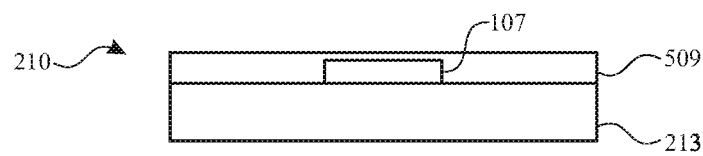
FIG. 5D illustrates a side view of components of a photonics die during processing.

In some examples, the overmold 509 can be additionally formed on top of the light emitter 107, such as shown in FIG. 5D. This is an optional processing operation and may be omitted in many embodiments.

Figure 5E:
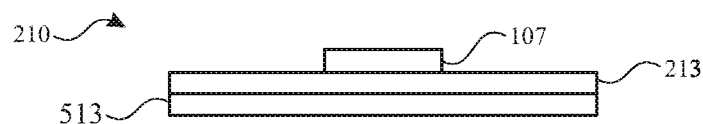
FIG. 5E illustrates a side view of components of a photonics die during processing.

FIG. 5E illustrates one way to reduce the thickness of a photonics die 210. Part of the substrate 213 may be removed from the back (e.g., from the side of the substrate opposite the one bonded to the light emitter 107) by using an etch process. In some instances, an etch stop layer 513 may be adjacent to the substrate 213 to prevent the etching process from over etching the substrate 213.

Figure 5F:
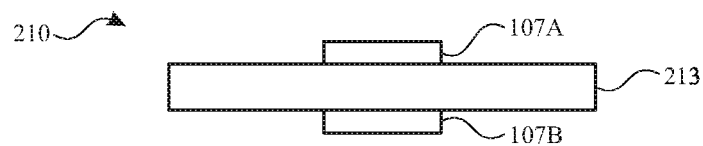
FIG. 5F illustrates a side view of components of a photonics die during processing.

In some examples, multiple sides of the substrate 213 may have light emitters 107A, 107B mounted thereto, as depicted in FIG. 5F. For example, the substrate 213 can include light emitter 107A located on a first side of the substrate 213 and light emitter 107B located on a second side of the substrate 213. In some examples, light emitter 107A can be configured to emit light having a first wavelength or set of wavelengths, while light emitter 107B can be configured to emit light having a second wavelength or set of wavelengths. Additionally, the structure of FIG. 5F may enable a photonics die 210 to emit light 109 along multiple planes.

FIG. 6 illustrates a light emitter layout on an epitaxial element of the photonics die. As illustrated in FIG. 6, epitaxial element 275 may include multiple light emitters 107, where the light emitters 107 are bonded into a silicon photonics system. As described below, the light emitters 107 may emit light into the silicon or the waveguides of the silicon photonics system. In some examples, there may be one or more epitaxial elements 275 disposed on a photonics die as appropriate. The light emitters 107 of FIG. 6 may emit light out of an edge of the stack that is adjacent to the offset direction of the photonics dies. The epitaxial element 275 may include electrical connections 232 (e.g., bonded connections) and optical paths 234 along with corresponding routing traces from the electrical connections 232 and the optical paths 234 to the light emitters 107. In some examples, the light paths 111 may be split off from a primary waveguide. In some examples, the light may be split off individually, in which case each light emitter 107 may have an individual pathway, the light may be tapped or split off of the optical combining element 621. Additionally in some examples, there may be laterally-spaced exit locations 619. In some examples, the optical combining element 621 may have multiple outputs or may also include a splitter located after the optical combining element 621.

Continuing the discussion of FIG. 6, the optical combining element 621 can receive light 108 emitted by the light emitters 107. In some examples, the optical combining element 621 may be a passive element and may combine the light into a waveguide. In some examples, the optical combining element may be an active element, such as an optical switch, which may switch between the light emitted by the light emitters or an optical multiplexer. The output from the optical combining element 621 can be light 109, which can exit the photonics die at location 619. In some examples, the epitaxial element 275 may combine light 108 emitted by the light emitters 107 to a waveguide. Although FIG. 6 depicts the light from each of the light emitters being combined by a light combining element 621 and emitted as combined light, in some examples each light emitter on the photonics die may include a corresponding waveguide extending to the edge of the photonics die so that light from each emitter may be emitted in separate beams. In some examples, the light emitted by the light emitters may be combined or multiplexed into a subset of outputs and the light may be emitted in those subsets. In some examples, the subsets may include the same group of repeating wavelengths and in some examples, the subsets may include groups of unique wavelengths. Additionally, although FIG. 6 depicts the light as being launched from a single output, light beams with different wavelengths or wavelength ranges may not be coincident on each other and may be separated by, for example, approximately 250 microns.

Figure 7A:
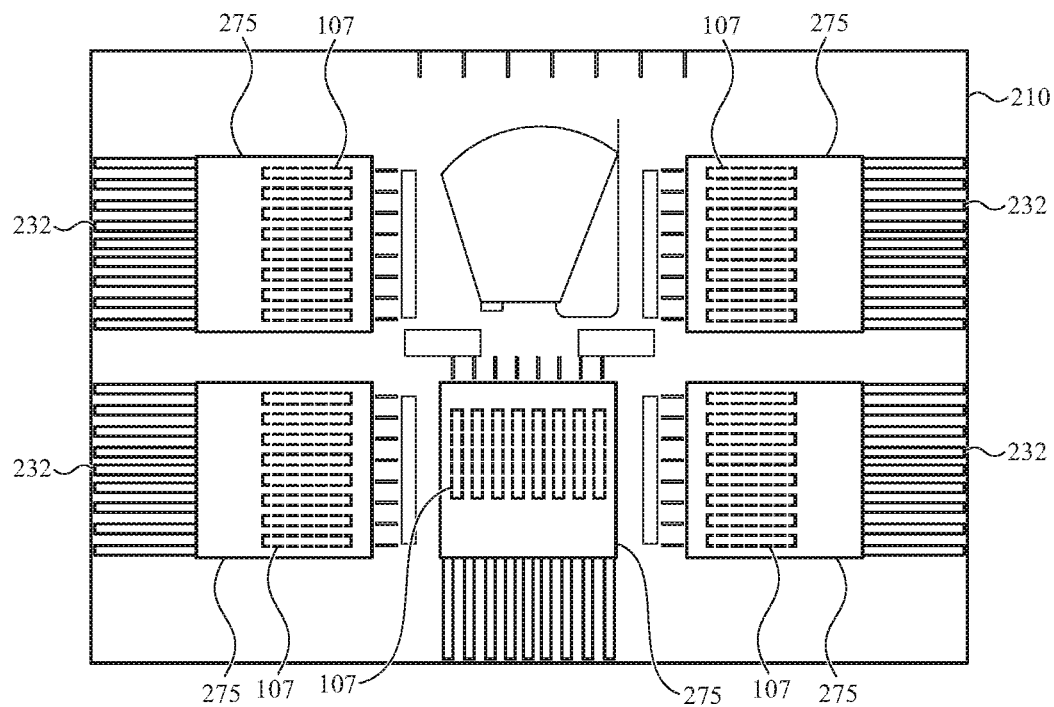
FIG. 7A illustrates a layout of epitaxial elements on a photonics die.

FIG. 7A illustrates a layout of sample epitaxial elements on a photonics die. In FIG. 7A, the photonics die 210 may include multiple epitaxial elements 275 and electrical connections 232. Each epitaxial element 275 may include one or more light emitting elements 107 as described with reference to FIG. 6. The light emitting elements 107 may or may not be visible from the top view of the photonics die 210 in FIG. 7A. In some examples, each epitaxial element may include eight light emitting elements, thus in the example of FIG. 7A, the photonics die 210 may include 40 light emitting elements on the five epitaxial elements 275. The light emitting elements included on an epitaxial element 275 may all emit the same wavelength of light or each light emitting element may emit a different wavelength of light from the other light emitting elements so that the photonics die 210 may emit a wavelength range of light. It should be appreciated that the layout shown is one example and other layouts are possible. Likewise, the number, size, and position of various elements, including light emitting elements 107, electrical connections 232, and epitaxial elements 275, may vary between embodiments.

In some examples, the wavelength range of light emitted by multiple photonics dies 210 may be a broadband wavelength range and may use any number of lasers, such as 120 lasers. In some examples, the number of lasers may be greater or fewer than 120 lasers. In some examples, fifteen epitaxial elements 275 may be distributed over three photonics dies, so that each photonics die includes five epitaxial elements 275 as shown in FIG. 7A, and each epitaxial element may include eight light emitting elements. Although specific numbers of epitaxial elements, lasers, and wavelength ranges are discussed, the number of epitaxial elements, light emitting elements, photonics dies, lasers, and wavelength ranges may vary as appropriate. Further, each of the epitaxial elements 275 may emit light over an approximate wavelength range of 0.07 μm.

In other examples, eight lasers per epitaxial element 275 may be used and fifteen epitaxial elements 275 may be included on the photonics die 210. Again, each of the epitaxial elements 275 may then emit light over an approximate wavelength range of 0.066 μm. Although specific numbers of photonics dies, lasers, epitaxial elements, and wavelength ranges are discussed, this is for explanatory purposes and these numbers may vary as appropriate.

Figure 7B:
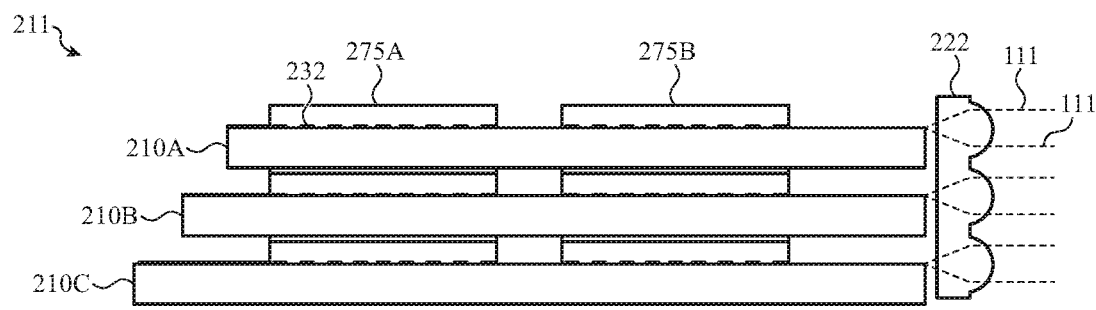
FIG. 7B illustrates a photonics die stack.

FIG. 7B illustrates another example photonics die stack and a light combining element. The photonics die stack 211 includes photonics dies 210A, 210B, and 210C and photonics die 210A includes epitaxial elements 275A and 275B. As shown in FIG. 7B, the stack 211 includes offset photonics dies 210 that emit light 111 through the light combining element 222. As shown in FIG. 7B, the epitaxial elements may vertically align with one another and the corresponding substrates may be different sizes to accommodate the electrical connections 232. In the example of FIG. 7B, the light may be emitted approximately parallel to the plane of the corresponding photonics die.

Figure 7C:
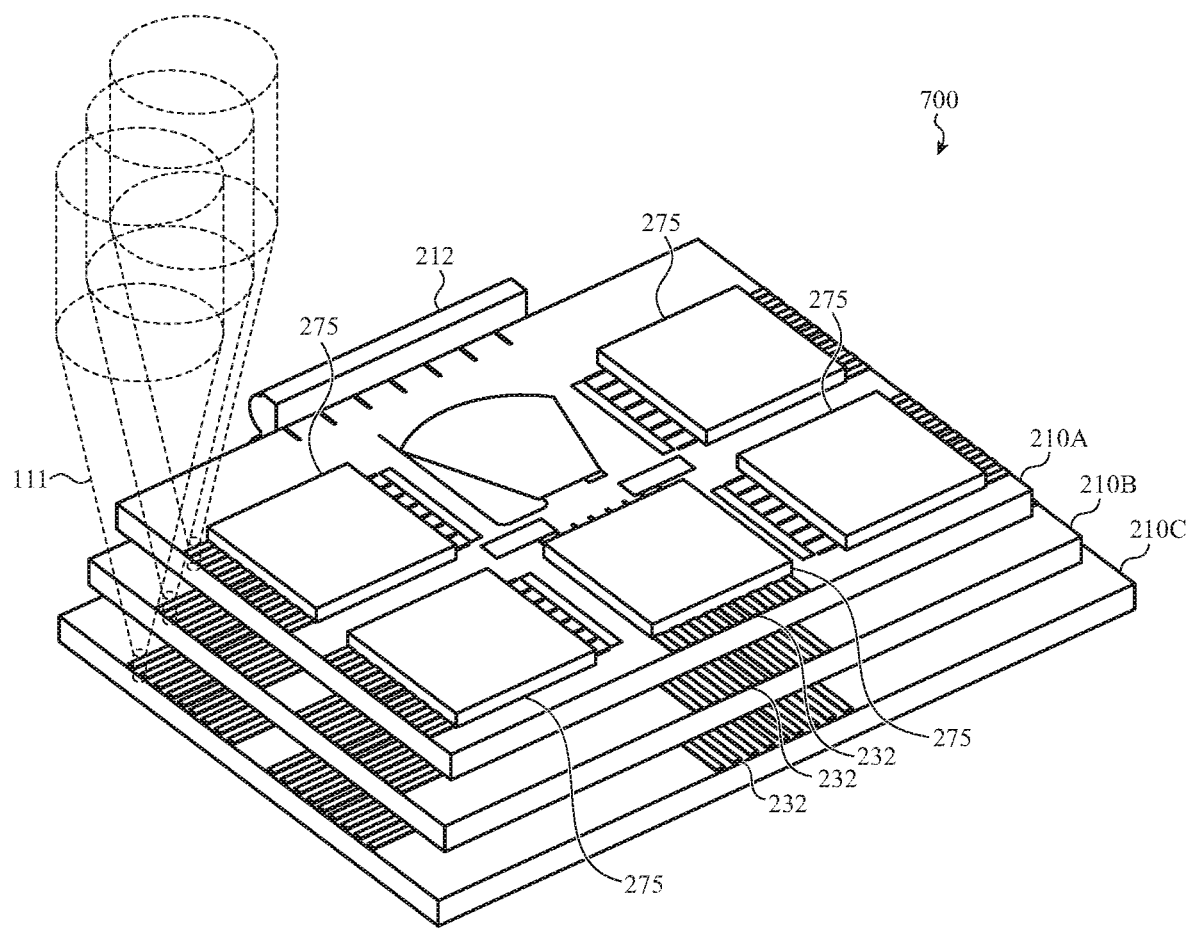
FIG. 7C illustrates a photonics die stack.

FIG. 7C illustrates still another example photonics die stack. The photonics die stack 700 includes photonics dies 210 and an optical element 212 and each of the photonics dies may emit light 111. It may be understood that the emitted light 111 may emit from the edge of the photonics dies 210. The photonics die stack 700 includes three photonics dies 210A, 210B, and 210C in an offset stack. Each of the photonics dies 210 includes five epitaxial elements 275 bonded to a substrate. Each of the epitaxial elements 275 may include eight light emitting elements (light emitting elements not illustrated in FIG. 7C) for a total of 120 light emitting elements. In some examples, the light emitting element may be lasers, diodes, or any appropriate light source including but not limited to coherent light sources, semi-coherent light sources, and so forth.

Figure 7D:
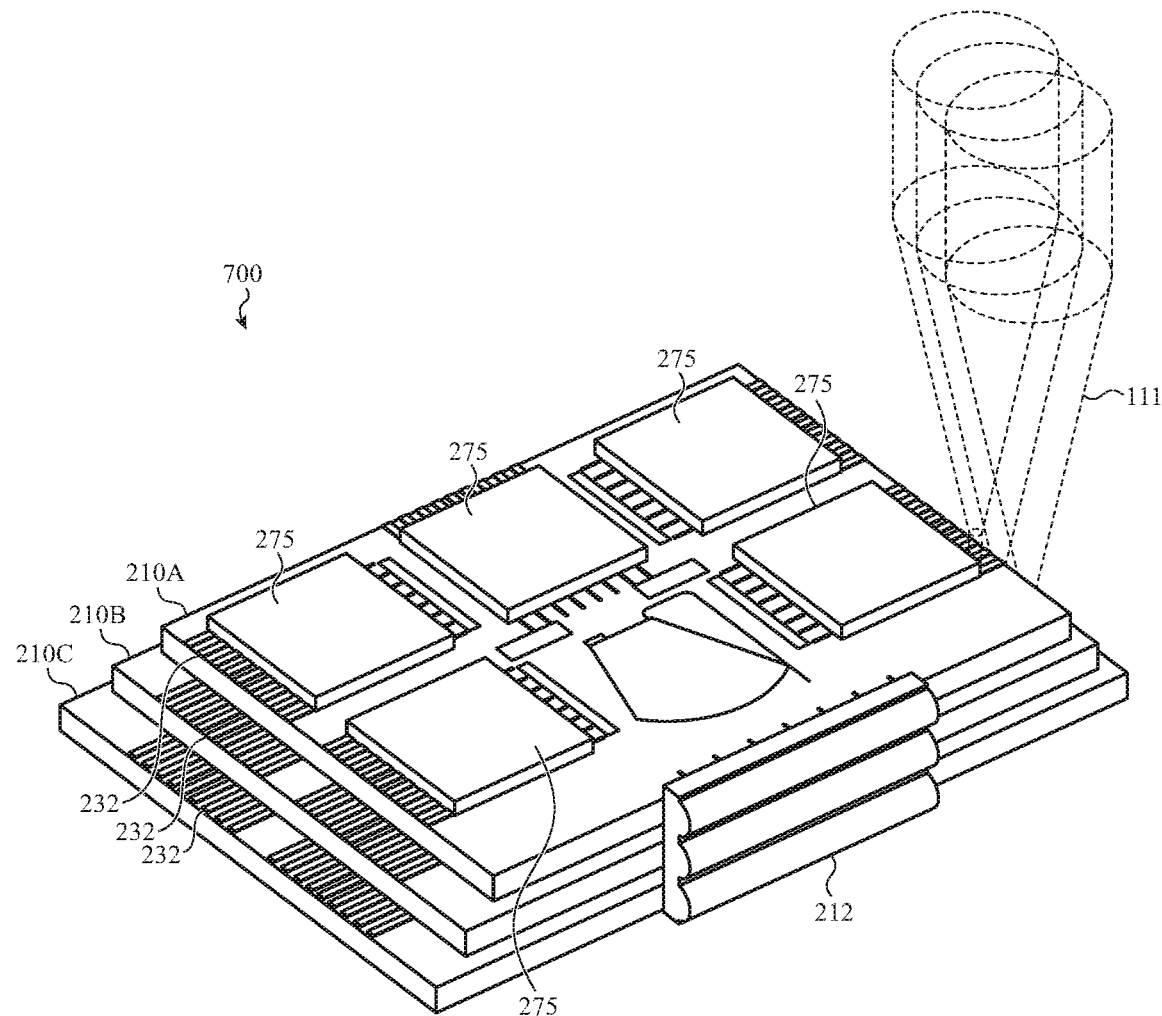
FIG. 7D illustrates a photonics die stack.

FIG. 7D illustrates yet another example photonics die stack and is similar to FIG. 7C, but from an alternative point of view. Similar to FIG. 7C, FIG. 7D illustrates a photonics die stack 700 that includes photonics dies 210 and an optical element 212, where each of the photonics dies may emit light 111. Similar to FIG. 7C, the emitted light 111 may be emitted from the edge of the photonics dies 210. As previously discussed, each of the photonics dies 210 includes five epitaxial elements 275 bonded to a corresponding substrate. As shown in FIG. 7D, the substrates may be different sizes to accommodate the electrical connections 232 and the edges of the photonics die stack 700 may not vertically align with one another on three sides of the photonics die stack. In FIG. 7D, the optical element 212 may abut the photonics dies 210 on the fourth side where the edges of the photonics dies may align so that the photonics dies may abut or be adjacent to the optical element 212. As used herein, the term "abutting" means that two elements share a common boundary or otherwise contact one another, while the term "adjacent" means that two elements are near one another and may (or may not) contact one another. Thus, elements that are abutting are also adjacent, although the reverse is not necessarily true. Two elements that are "coupled to" one another may be permanently or removably physically coupled to one another and/or operationally or functionally coupled to one another. Additionally, the optical element 212 may be used in conjunction with the light combining optical element 222.

Figure 8:
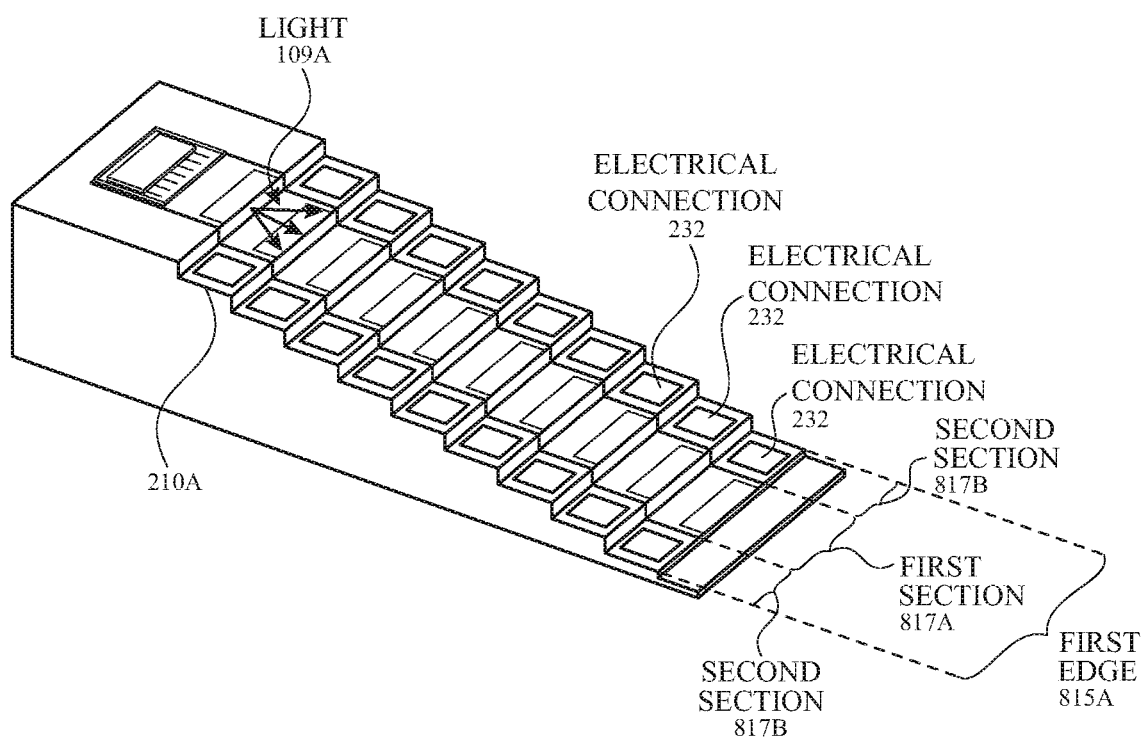
FIG. 8 illustrates a package with photonics dies.

FIG. 8 illustrates a package with photonics dies. In some examples, the stack can be configured such that the exposed surface of the phonics die located at the at least one edge of the photonics die 210 may be used for multiple purposes, such as emitting light and for electrical connections. As illustrated in FIG. 8, multiple photonics dies may be arranged to create an offset vertical stack configuration and the stack can include a first stack edge 815A. The first stack edge 815A can include one or more first sections 817A and one or more second sections 817B. The first section 817A may define a region where light 109 may be emitted from a respective photonics die 210. The second sections 817B generally are positioned to the sides of the first section and can include or define electrical connections 232 between adjacent photonics dies.

Operation of a Photonics Assembly

Figure 9:
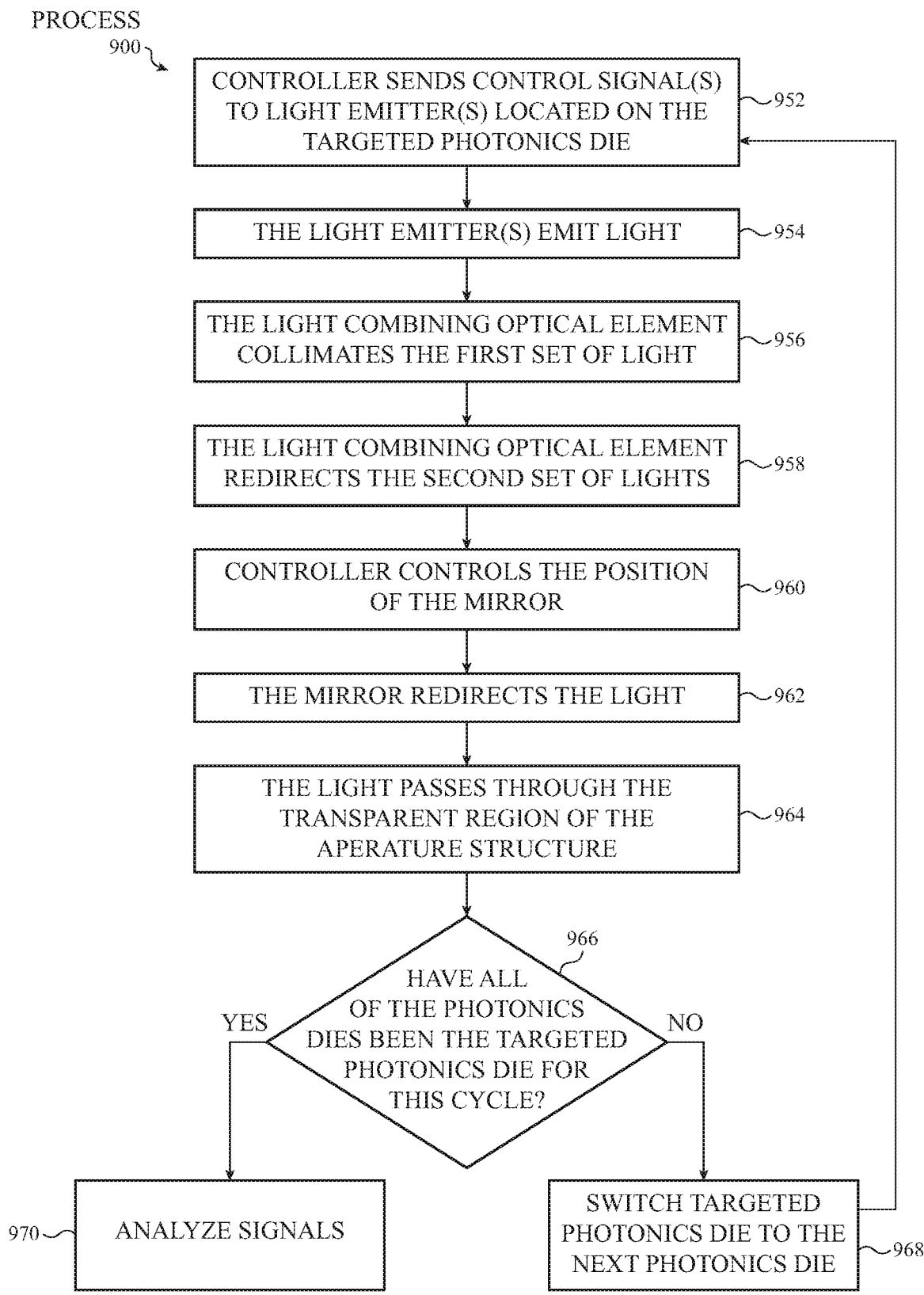
FIG. 9 is a flowchart of a process for operating a photonics assembly using a linear scan.

FIG. 9 is a flowchart of a process for operating a photonics assembly using a linear scan. In some examples, the linear scan of FIG. 9 can include operating the photonics dies in serial. For example, a first photonics die can be operated at a first time; a second photonics die can be operated at a second time; and so forth. The first time may be separate from and non-overlapping with the second time.

Process 900 can begin at operation 952 with a controller (as illustrated in FIG. 1) transmitting one or more control signals to one or more light emitters located on the targeted photonics die. The targeted photonics die may refer to the photonics die of interest at a given time. The targeted photonics die may be selected based on any number of functions such as the range of emitted wavelengths or because the photonics die is the next photonics die in the scanning operation of the photonics assembly. For example, in a linear scan, the targeted photonics die may initially be the first photonics die 210A, then the targeted photonics die may change to the second photonics die 210B, followed by the targeted photonics die switching to the third photonics die 210C, and so forth. The control signals can be transmitted from the controller to the light emitters using the routing traces of the optical element 212 and the electrical connections and optical paths located on the respective photonics die 210.

At operation 954, the light emitters on the targeted photonics die may emit light 109A at a first time, second light 109B at a second time, and so forth. The light combining optical element 222 may receive the respective light and at operation 956 may combine and/or collimate the light emitted by the light emitters on the targeted photonics die. At operation 958, the light directing optical element 224 may receive the light from the light combining optical element 222 and may redirect the light to the mirror 226.

At 960, the mirror 226 may receive the light and a controller may be coupled to the mirror and can control the position of the mirror for redirecting the light as indicated at operation 962. Also at operation 962, the position of the mirror may be such that it redirects light to pass through the transparent region 228A of the aperture structure 228 at operation 964. In some examples, the angle of the mirror may depend on which photonics die 210 is emitting light, the wavelength(s) of the emitted light, or both. For example, the photonics die 210A can be at the top of the stack and can be associated with a first position of the mirror. The photonics die 210B may be positioned beneath the photonics die 210A and can be associated with a second position of the mirror. Different photonics dies 210 may be associated with different positions of the mirror due to the different positions of the photonics dies 210 within the stack 211. As another example, a first position of the mirror can be associated with a first wavelength or first wavelength range, and a second position of the mirror can be associated with a second wavelength or second wavelength range.

As indicated in operations 966 and 968, operations 952-964 may be repeated in a cycle until all of the photonics dies with light emitters have become the targeted photonics. When a targeted photonics die 210 changes to a different photonics die 210, the position of the mirror may be changed accordingly. In some examples, the position of the mirror may be related to the position of the photonics dies within the stack. In some examples, the position of the mirror may be incrementally adjusted. At the end of a cycle and at operation 970, a processor can analyze the signals. The cycle can be associated with a given sequence of photonics dies and the sequence of photonics dies can include the same order as the photonics dies within the stack 211, or may include a different order. In some examples, the sequence may include only some of the photonics dies in the stack 211.

Figure 10:
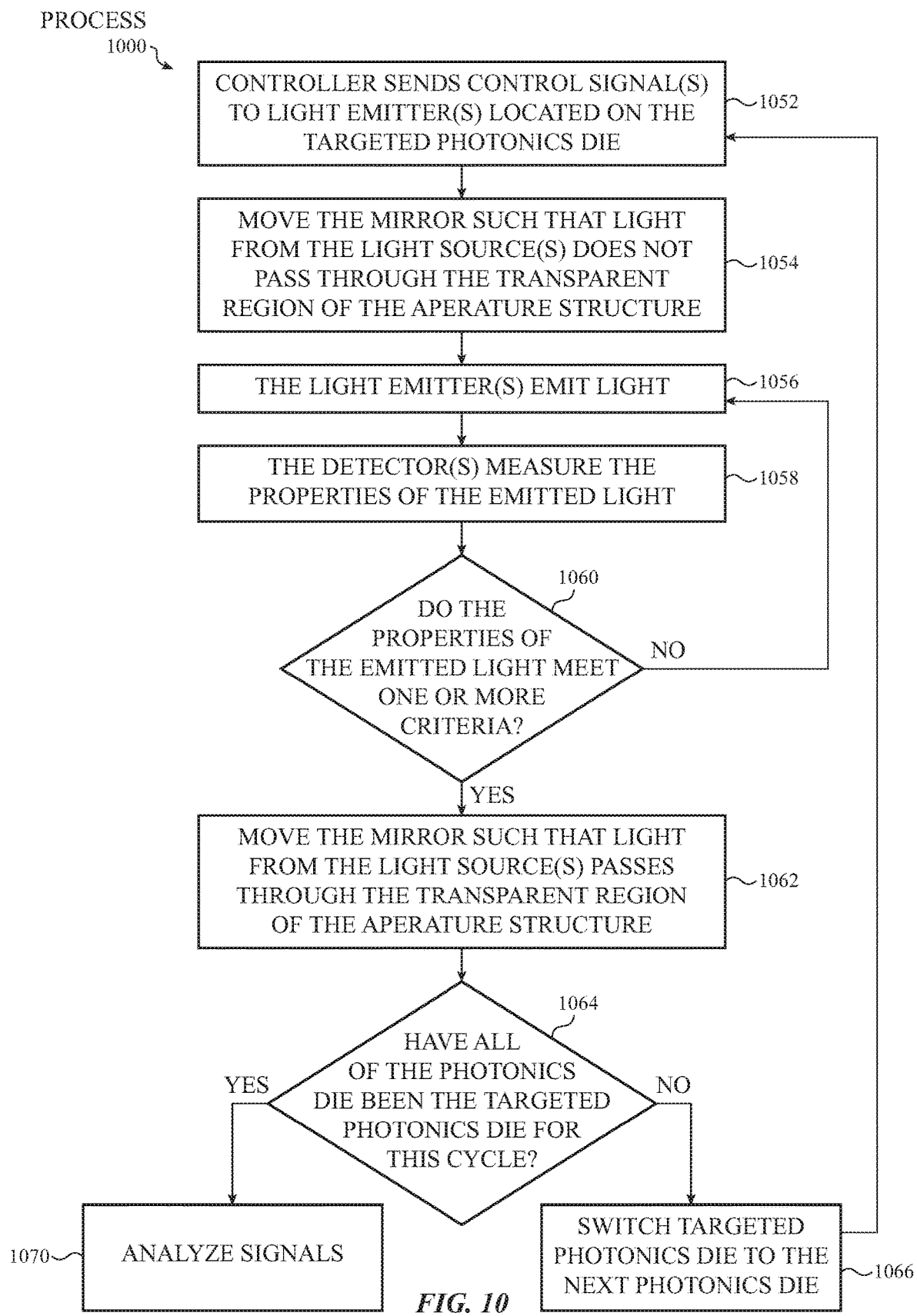
FIG. 10 is a flowchart of a process for operating a photonics assembly for monitoring purposes.

FIG. 10 is a flowchart of a process for operating a photonics assembly for monitoring purposes. In some examples, the process can be operated to monitor properties of the photonics assembly such as the emitted wavelength(s). The properties can be satisfied when the light emitter(s) of a given photonics die reaches a targeted stability point. Similar to process 900, process 1000 can begin with operation 1052, with a controller sending one or more control signals to one or more light emitters located on the targeted photonics die. The targeted photonics die may refer to the photonics die of interest at a given time. The targeted photonics dies may be selected based on any number of functions such as the range of emitted wavelengths or because the photonics die is the next photonics die in the scanning operation of the photonics assembly. For example, the targeted photonics die may initially be the first photonics die 210A. After the emitted wavelength emitted by the first photonics die 210A is monitored and confirmed, the targeted photonics die may change to the second photonics die 210B, and so forth. The control signals may be similarly transmitted as discussed with respect to FIG. 9.

At operation 1054, the mirror 226 can be positioned such that light from the light source(s) do not pass through the transparent region 228A of the aperture structure 228. At operation 1056, the light emitters on the targeted photonics die may emit light 109A at a first emitting time, and may emit light 109B at a second emitting time, and so forth. At operation 1058, one or more detectors can measure the properties of the emitted light. In some examples, the detector(s) can be located on a photonics die 210 of the stack 211 and can receive the optical signals from the light emitters using the optical element 212, as discussed herein.

At operation 1060, a controller can be used to determine whether the properties of the emitted light such as wavelength or power, as measured by the detector(s), meet one or more criteria. The criteria may be a stability point or a stability range for the emitted light of the light sources or the criteria may be based on a predetermined specification, for example. The predetermined specification may be a target wavelength range or may be a target optical power. If the emitted light has not met the criteria, then the process 1000 can wait for the emitted light to meet the criteria by repeating operations 1056 and 1058.

If the emitted light meets the criteria, then at 1062 the mirror can be positioned such that light from the light source(s) passes through the transparent region of the aperture structure 228. Operations 1052-1062 may be repeated in a cycle per operations 1064 and 1066 until all of the photonics dies which emit light have been the targeted photonics dies. Once a different photonics die is the targeted photonics die 210, the position of the mirror may be changed accordingly, as discussed herein. At operation 1070, the end of a cycle, a processor can analyze the signals.

Although FIGS. 9 and 10 illustrate an overview of operations of the photonics assembly, further examples can include additional steps, sub-steps, operations, sub-operations, processes, and sub-processes such as those discussed herein in the context of the other figures.

Photonics Die with III-V Materials Only

FIGS. 11A-11H illustrate both cross-sectional and top views of a photonics die with III-V materials instead of both III-V and silicon materials. For example, the substrate 213 may not be silicon as previously discussed in FIG. 5, but instead is a III-V substrate. In some instances, the light emitters included in the photonics die may be distributed feedback lasers (DFBs) which may have gratings formed with III-V materials such as a III-V substrate. These DFBs will be discussed herein with respect to FIGS. 11A-13. As shown in FIGS. 11A-11H, the substrate 1115 is indicated with a cross-hatching pattern which may indicate the substrate 1115 in each of these figures.

Figure 11A:
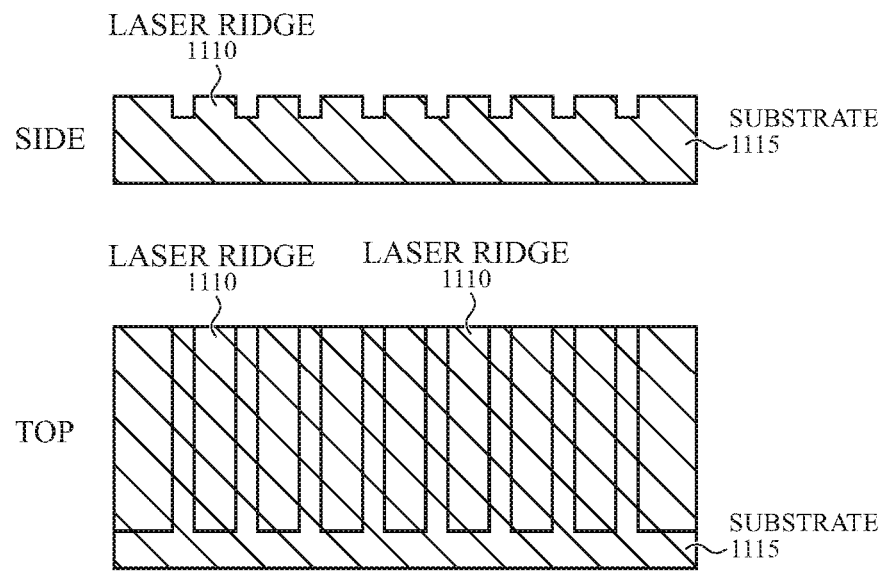
Figure 11B:
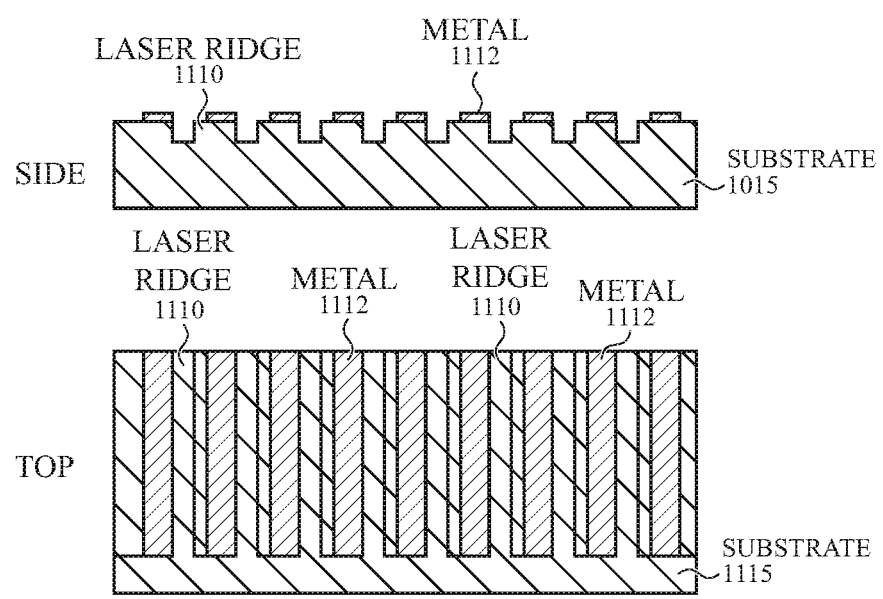
Figure 11C:
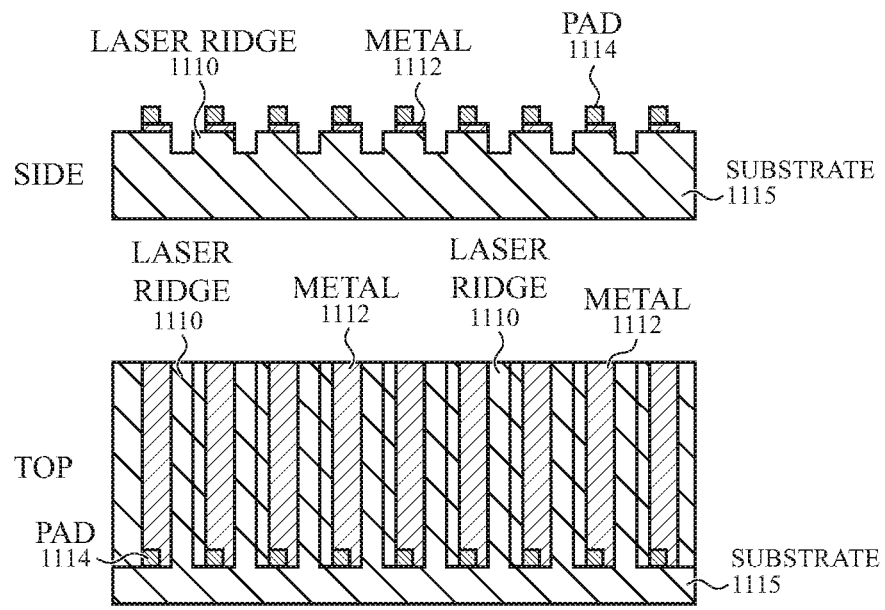
Figure 11D:
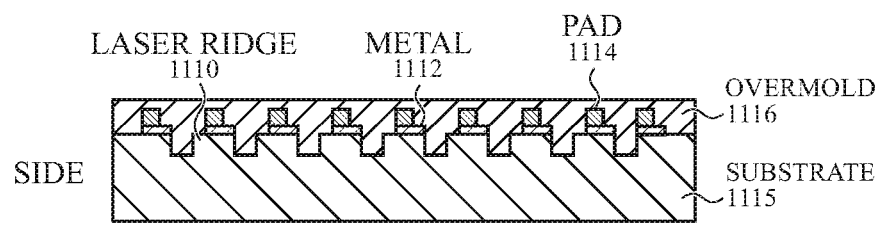
Figure 11E:
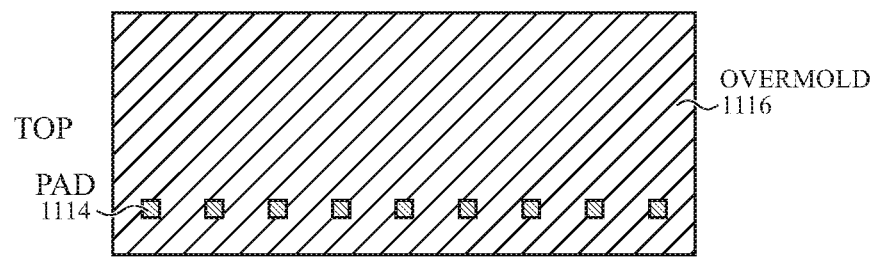
Figure 12:
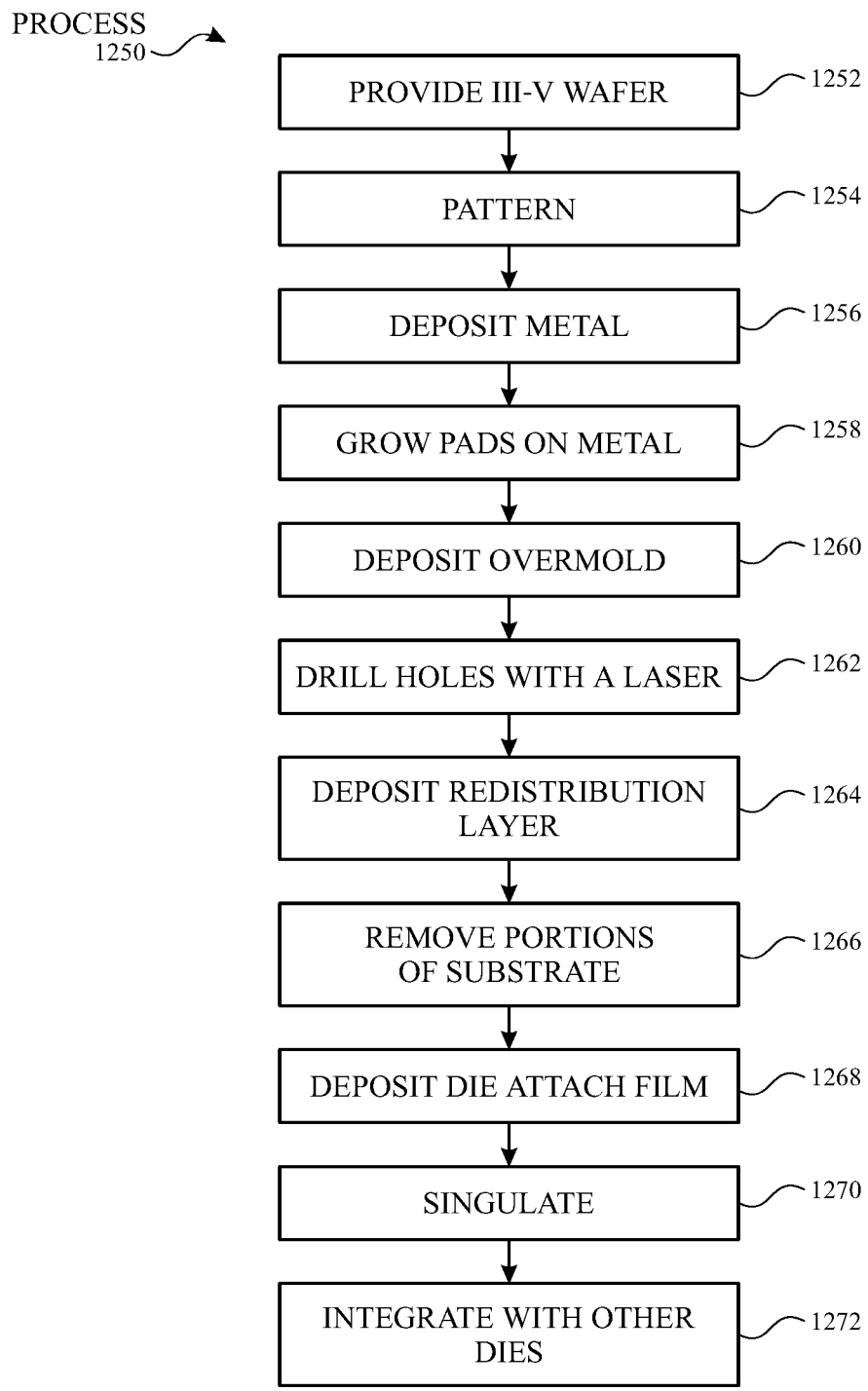
FIG. 12 is a flowchart of a process flow for fabricating a photonics die with III-V materials.

FIG. 12 is a flowchart of a process flow for fabricating a photonics die with III-V materials, and may include operations that correspond to FIGS. 11A-11H. Accordingly, the operations of FIG. 12 are discussed with reference to the corresponding ones of FIGS. 11A-11H.

As illustrated in the process 1250 of FIG. 12, in operation 1252, a III-V wafer can be provided as a substrate 1115 as illustrated in FIG. 11A. FIG. 11A shows both cross-sectional and top views of the substrate 1115. At operation 1254 and as illustrated in FIG. 11A, laser ridges 1110 can be formed by patterning the substrate 1115. At operation 1256, metal 1112 can be deposited on top of the substrate 1115 and laser ridges 1110, as shown in the top view of FIG. 11B. Part of the deposited metal may be removed from each of the laser ridges 1110 and the surface of the substrate 1115 as illustrated in the top view of FIG. 11B. At operation 1258 and as illustrated in FIG. 11C, pads 1114 can be deposited on top of the metal 1112.

In operation 1260 and as shown in the side view of FIG. 11D, an overmold 1116 can be deposited on the metal 1112. In operation 1262 and as shown in the top view of FIG. 11E a grinding operation can expose the pads 1114. As shown in FIG. 11F and in operation 1264, a redistribution layer 1118 can be deposited on the overmold 1116. Following the deposition of the redistribution layer 1118, at operation 1266 and as shown in FIG. 11G, portions of the substrate 1115 can be optionally removed in order to thin the resulting photonics die and metal traces may be added to connect the pads 1114 to a second set of pads on the left side of the substrate 1115.

In operation 1268 and as shown in FIG. 11H, a film 1120, such as a die attach film, can be deposited on the redistribution layer 1118. At operation 1270, chips can be diced (e.g., singulated), and the process can proceed with operation 1272 of integrating with other photonics dies. The integration with other photonics dies can include stacking photonics die 210A on top of photonics die 210B, as shown in the top view of FIG. 11I. The integration may also include forming electrical connections 232, as shown in the top and cross-sectional views of FIG. 11J. In some examples, laser drilling may be followed by a metal fill to create the pads 1114.

As previously discussed with respect to FIG. 6, a stripe of light may be formed due to the varying positions of the photonics dies 210 and/or the varying positions of the one or more light emitters within each photonics die 210. When using DFBs only, the stripe may be created per each photonics die. In some examples, the photonics die may include a first grating which may be tuned to a first wavelength, a second grating which may be tuned to a second wavelength, a third grating which may be tuned to a third wavelength, and so forth. These gratings may be located such that the light may be launched directly out of the photonics die and/or via a waveguide, thus creating a stripe of light. In some examples, the stripe may be created by repeating the DFB structure as the DFBs may be made of the same material.

Figure 13:
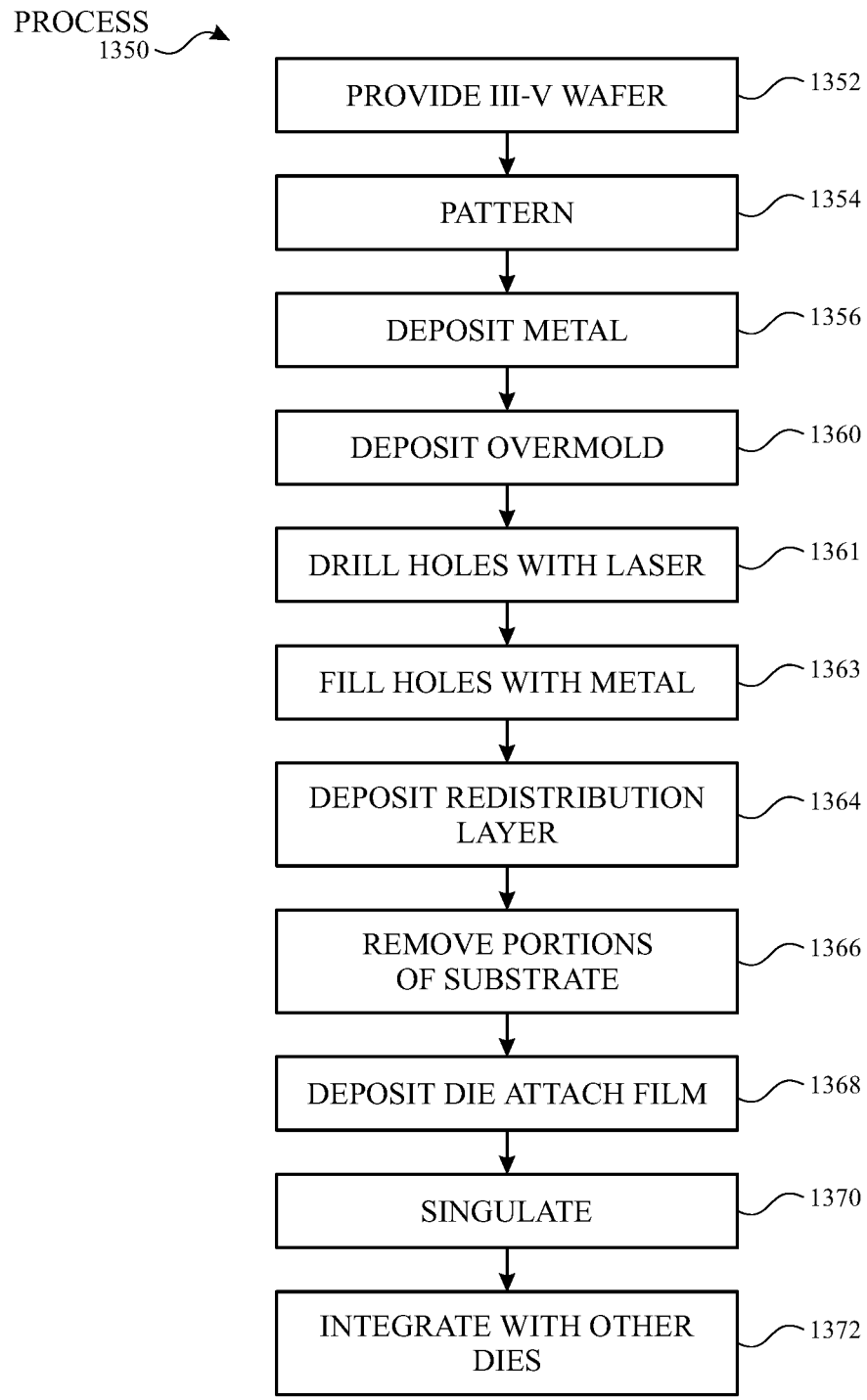
FIG. 13 is a flowchart of a process flow for fabricating a photonics die with III-V materials.

FIG. 13 is a flowchart of a process flow for fabricating a photonics die with III-V materials. Process 1350 can include operations 1352, 1354, 1356, 1364, 1366, 1368, 1370, and 1372 that may be correspondingly similar to operations 1252, 1254, 1256, 1264, 1266, 1268, 1270, and 1272 of process 1250 of FIG. 12. Process 1350 may also include operation 1360 for depositing an overmold. Operation 1360 may be similar to operation 1260, but the overmold may be deposited before the pads are grown. In some examples, the grinding operation (e.g., operation 1262 of FIG. 11) may be omitted.

Following operation 1360, at operation 1361 holes may be drilled in the overmold, and at operation 1363, the holes may be filled with metal. Process 1350 may proceed with operations 1364, 1366, 1368, 1370, and 1372 as discussed herein.

The foregoing description, for purposes of explanation, uses specific nomenclature to provide a thorough understanding of the described embodiments. However, it will be apparent to one skilled in the art, after reading this description, that the specific details are not required in order to practice the described embodiments. Thus, the foregoing descriptions of the specific embodiments described herein are presented for purposes of illustration and description. They are not targeted to be exhaustive or to limit the embodiments to the precise forms disclosed. It will be apparent to one of ordinary skill in the art, after reading this description, that many modifications and variations are possible in view of the above teachings.

Although the disclosed examples have been fully described with reference to the accompanying drawings, it is to be noted that various changes and modifications will become apparent to those skilled in the art. Such changes and modifications are to be understood as being included within the scope of the disclosed examples as defined by the appended claims.

What is claimed is:

1. A photonics system, comprising:
   a set of photonics dies arranged in an offset vertical stack, each photonics die in a different plane than each of the other photonics dies, the set of photonics dies comprising:
      a first light emitter configured to emit first light in a first wavelength range; and
      a second light emitter configured to emit second light in a second wavelength range that is different than the first wavelength range, wherein the second light emitter is positioned between an overlapping region of two adjacent photonics dies of the set of photonic dies; and
   an optical element configured to receive and collimate the first light and the second light into collimated light.

2. The photonics system of claim 1, wherein:
   each of the set of photonics dies is overlapping and offset in a first direction from all adjacent photonics dies;
   each of the set of photonics dies emits light in a second direction that is orthogonal to the first direction; and
   the photonics system further comprises a mirror configured to receive and reflect the collimated light from the optical element.

3. The photonics system of claim 1, further comprising an optical detecting element configured to detect optical signals of each photonics die of the set of photonics dies.

4. The photonics system of claim 1, wherein the set of photonics dies further comprises a detector configured to monitor at least one of the first or second light emitted by at least one of the first or second light emitters.

5. The photonics system of claim 1, further comprising:
an aperture structure configured to receive the collimated and reflected light from the mirror and including:
 a first section that is at least partially optically transparent; and
 a second section that is at least partially optically opaque; and
a prism configured to receive and reflect the collimated light from the optical element.

6. The photonics system of claim 1, wherein:
the optical element is a first optical element; and
the photonics system further comprises:
a second optical element configured to receive the collimated light from the first optical element and to redirect the collimated light to the mirror.

7. The photonics system of claim 1, wherein:
the optical element comprises an array of cylindrical microlenses; and
each cylindrical microlens is configured to receive the first light from a unique one of the set of photonics dies.

8. The photonics system of claim 7, further comprising a controllable actuator coupled to the optical element and configured to align the array of cylindrical microlenses.

9. The photonics system of claim 1, wherein the mirror is a microelectromechanical systems (MEMS) mirror comprising a set of individually controlled reflectors.

10. A method of operating a photonics system, comprising:
emitting a first light having a first wavelength range from a first set of photonics dies;
emitting a second light having a second wavelength range from a second set of photonics dies;
receiving, by a first optical element, the first light and the second light;
receiving, by a second optical element, the first light and the second light; and
receiving, by a mirror, the first light and the second light from the second optical element; wherein:
the second optical element is configured to redirect the first and second wavelength ranges of light; and
the first set of photonics dies and the second set of photonics dies are arranged in an offset stack such that each of the first set of photonics dies and the second set of photonics dies is laterally offset from every adjacent one of the first set of photonics dies and the second set of photonics dies, a light emitter positioned between an overlapping region of two adjacent photonics dies of the first set of photonic dies.

11. The method of claim 10, wherein:
the first light is emitted at a first time; and
the second light is emitted at a second time that is different from the first time.

12. The method of claim 11, further comprising:
receiving, by an aperture structure, the first light and the second light from the mirror, the aperture structure comprising:
 a first section that is at least partially optically transparent; and
 a second section that is at least partially optically opaque.

13. The method of claim 12, further comprising:
receiving, by the mirror, one or more control signals from a controller; and
adjusting a position of the mirror based on the one or more control signals.

14. The method of claim 13, further comprising adjusting the position of the mirror at the first time such that the first wavelength range of light does not pass through the first section of the aperture structure.

15. The method of claim 13, further comprising:
monitoring, by a detector coupled to a set of photonics dies, the first light and the second light;
determining whether a property of the first light or the second light meets a criterion; and
in the event the first light or the second light meets the criterion, adjusting the position of the mirror such that the first light and the second light pass through a first region of the aperture structure.

16. The method of claim 10, further comprising:
receiving, by an actuator, a control signal; and
in response to receiving the control signal, actuating the actuator in order to align the first optical element with light emitted from at least one photonics die of the first and second sets of photonics dies.

17. The method of claim 10, further comprising:
monitoring, by a detector coupled to the first and second sets of photonics dies, the first light and the second light.

18. A photonics assembly, comprising:
a first photonics die including a first light emitter configured to emit light along a light path;
a second photonics die offset in a first direction from, and stacked below, the first photonics die, the second photonics die including a second light emitter configured to emit light along the light path, the second light emitter positioned in an overlapping region between the first photonics die and the second photonics die;
an optical element configured to receive light from the first and second light emitters along the light path, and further configured to collimate the received light; and
an aperture structure configured to receive light from the optical element along the light path; wherein:
the light path is in a second direction that is perpendicular to the first direction.

19. The photonics assembly of claim 18, further comprising a second optical element configured to receive collimated light from the optical element and redirect the collimated light to the aperture structure.

20. The photonics assembly of claim 18, further comprising a third photonics die offset in the first direction from, and stacked above, the first photonics die; wherein:
the third photonics die is configured to receive light from the first photonics die; and
the third photonics die is further configured to monitor the light from the first photonics die.

* * * * *